US010373877B1

(12) United States Patent
Wang et al.

(10) Patent No.: US 10,373,877 B1
(45) Date of Patent: Aug. 6, 2019

(54) METHODS OF FORMING SOURCE/DRAIN CONTACT STRUCTURES ON INTEGRATED CIRCUIT PRODUCTS

(71) Applicant: GLOBALFOUNDRIES Inc., Grand Cayman (KY)

(72) Inventors: Haiting Wang, Clifton Park, NY (US); Hong Yu, Rexford, NY (US); Hui Zang, Guilderland, NY (US); Wei Zhao, Fort Lee, NJ (US); Yue Zhong, Ballston Lake, NY (US); Guowei Xu, Ballston Lake, NY (US); Laertis Economikos, Wappingers Falls, NY (US); Jerome Ciavatti, Malta, NY (US); Scott Beasor, Greenwich, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/986,390

(22) Filed: May 22, 2018

(51) Int. Cl.
*H01L 21/8234* (2006.01)
*H01L 21/311* (2006.01)
(Continued)

(52) U.S. Cl.
CPC ......... *H01L 21/823481* (2013.01); *H01L 21/31144* (2013.01); *H01L 21/76224* (2013.01); *H01L 21/823418* (2013.01); *H01L 21/823431* (2013.01); *H01L 21/823814* (2013.01); *H01L 21/823821* (2013.01); *H01L 21/845* (2013.01);
(Continued)

(58) Field of Classification Search
CPC ..... H01L 21/823431; H01L 21/823821; H01L 21/845; H01L 21/823418; H01L 21/823814; H01L 21/76224; H01L 21/31144; H01L 27/0886; H01L 27/0924; H01L 27/10826; H01L 27/10879; H01L 27/1211; H01L 29/66545
See application file for complete search history.

(56) References Cited

U.S. PATENT DOCUMENTS 8,878,300 B1 11/2014 Liu et al.
2014/0217517 A1 8/2014 Cai et al.
(Continued)

*Primary Examiner* — Joseph C. Nicely
(74) *Attorney, Agent, or Firm* — Amerson Law Firm, PLLC

(57) ABSTRACT

One illustrative method disclosed herein includes forming a plurality of transistors on a semiconductor substrate, wherein each of the transistors comprise source/drain epitaxial semiconductor material in the source/drain regions, a contact etch stop layer (CESL) positioned above the source/drain epitaxial semiconductor material and an insulating material positioned above the contact etch stop layer, and forming a plurality of contact isolation cavities by performing at least one etching process sequence, wherein the etching process sequence is adapted to sequentially remove the insulating material, the CESL and the source/drain epitaxial semiconductor material, and forming a contact isolation structure in each of the contact isolation cavities. In this example, the method also includes, after forming the contact isolation structures, removing the sacrificial gate structures so as to form a plurality of replacement gate cavities, and forming a final gate structure in each of the plurality of replacement gate cavities.

20 Claims, 23 Drawing Sheets

(51) Int. Cl.
  *H01L 29/66*  (2006.01)
  *H01L 21/8238*  (2006.01)
  *H01L 27/088*  (2006.01)
  *H01L 27/092*  (2006.01)
  *H01L 27/108*  (2006.01)
  *H01L 21/762*  (2006.01)
  *H01L 27/12*  (2006.01)
  *H01L 21/84*  (2006.01)

(52) U.S. Cl.
  CPC ...... *H01L 27/0886* (2013.01); *H01L 27/0924* (2013.01); *H01L 27/10826* (2013.01); *H01L 27/10879* (2013.01); *H01L 27/1211* (2013.01); *H01L 29/66545* (2013.01)

(56) References Cited

U.S. PATENT DOCUMENTS

| | | | |
|---|---|---|---|
| 2015/0076609 A1* | 3/2015 | Xie | H01L 29/785 257/365 |
| 2015/0325692 A1 | 11/2015 | Zang | |
| 2017/0125292 A1* | 5/2017 | Greene | H01L 29/665 |
| 2018/0033870 A1* | 2/2018 | Huang | H01L 29/66795 |
| 2018/0047634 A1* | 2/2018 | Jun | H01L 21/823481 |
| 2019/0006345 A1* | 1/2019 | Wang | H01L 27/0207 |
| 2019/0043761 A1* | 2/2019 | Min | H01L 21/823821 |
| 2019/0067120 A1* | 2/2019 | Ching | H01L 21/823481 |

* cited by examiner

METHODS OF FORMING SOURCE/DRAIN CONTACT STRUCTURES ON INTEGRATED CIRCUIT PRODUCTS

BACKGROUND OF THE INVENTION

1. Field of the Invention

The present disclosure generally relates to the fabrication of integrated circuits, and, more particularly, to various methods of forming source/drain contact structures on integrated circuit (IC) products and various novel IC products.

2. Description of the Related Art

A conventional field effect transistor (FET) is a planar device wherein the entire channel region of the device is formed parallel and slightly below the planar upper surface of a semiconducting substrate. In contrast to a planar FET, there are so-called 3D devices, such as an illustrative FinFET device, which is a three-dimensional structure. FIG. 1 is a perspective view of an illustrative prior art FinFET device 10 that is formed above a semiconductor substrate 12 wherein the fins 14 (e.g., features) of the device 10 are made of the material of the substrate 12, e.g., silicon. The device 10 includes a plurality of fin-formation trenches 13, three illustrative fins 14, a gate structure 16, a sidewall spacer 18 and a gate cap 20. An insulating material 17, e.g., silicon dioxide, provides electrical isolation between the fins 14. The gate structure 16 is typically comprised of a layer of insulating material (not separately shown), e.g., a layer of high-k insulating material (k value of at least 10 or greater), and one or more conductive material layers that serve as the gate electrode for the device 10. The gate structure 16 may be manufactured using well-known gate-first or replacement gate manufacturing techniques. The fins 14 have a three dimensional configuration: a height H, a width W and an axial length L. The axial length L of the fins 14 extends in the gate length direction of the FinFET device 10, i.e., the direction of current travel in the device 10 when it is operational. The gate width direction of the device 10 is orthogonal to the gate length direction. The portions of the fins 14 that are covered by the gate structure 16 are the channel regions of the FinFET device 10. The portions of the features or fins 14 that are positioned outside of the spacers 18 will become part of the source/drain regions of the device 10.

After the gate structure 16 (sacrificial or final), the gate cap 20 and the spacer 18 are formed, an epitaxial growth process will be formed to form epitaxial semiconductor material (shown in dashed lines on only one of the fins 14) having a diamond-like cross-sectional configuration on the portions of each of the fins 14 in the source/drain regions of the device 10. At some point thereafter, a metal silicide material (not shown) will be formed on the epi semiconductor material in the source/drain regions of the device 10 to reduce the contact resistance between a conductive contact (that will be formed) and the source/drain regions of the device. In some cases, the metal silicide material may only be formed on essentially the top or upper surface portions of the epi semiconductor material formed on the fins. In other cases, the metal silicide material may be formed on the upper surface portions and both of the side surface portions of the epi semiconductor material.

Semiconductor memory devices are in widespread use in many modern integrated circuit (IC) products. In general, memory devices are the means by which electrical information is stored. There are many types of memory devices, e.g., SRAMs (Static Random Access Memory), DRAMs (Dynamic Random Access Memory), ROMs (Read Only Memory), etc., each of which has its own advantages and disadvantages relative to other types of memory devices. One embodiment of an SRAM memory cell, known as a 6T (six-transistor) SRAM memory cell, includes two NMOS pass gate transistors, two PMOS pull-up transistors, and two NMOS pull-down transistors. The configuration, layout and function of such 6T SRAM memory cells are well known to those skilled in the art. In some cases, such SRAM cells are made with a plurality of FinFET transistor devices. However, with continued reduction in the physical size (i.e., scaling) of SRAM cells and the associated decrease in fin pitch and fin size, there is less physical space for the formation of the source/drain epi semiconductor material on the portions of the fins in the source/drain regions of the devices. As a practical effect, the scaling of SRAM cells has the effect of limiting the size of the epi semiconductor material formed on the fins. In turn, reducing the size of the source/drain epi semiconductor material and the conductive contact that will be formed to establish electrical contact with the source/drain region will reduce the performance of the individual FinFET devices as well as the performance of the overall SRAM memory cell.

The present application is generally directed to various methods of forming source/drain contact structures on integrated circuit (IC) products and various novel IC products that may solve or at least reduce one or more of the problems identified above.

SUMMARY OF THE EMBODIMENTS

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming source/drain contact structures on integrated circuit products. In one illustrative example, a method disclosed herein includes forming a plurality of transistor devices on a semiconductor substrate, wherein each of the transistor devices comprises a sacrificial gate structure, a gate cap, source/drain regions, source/drain epitaxial semiconductor material in the source/drain regions, a contact etch stop layer positioned above the source/drain epitaxial semiconductor material and an insulating material positioned above the contact etch stop layer. In this example, the method also includes forming a plurality of contact isolation cavities by performing at least one etching process sequence, wherein the etching process sequence is adapted to sequentially remove the insulating material, the contact etch stop layer and the source/drain epitaxial semiconductor material, and forming a contact isolation structure in each of the contact isolation cavities. In this example, the method also includes, after forming the contact isolation structures, removing the sacrificial gate structures so as to form a plurality of replacement gate cavities, and forming a final gate structure in each of the plurality of replacement gate cavities.

BRIEF DESCRIPTION OF THE DRAWINGS

The disclosure may be understood by reference to the following description taken in conjunction with the accompanying drawings, in which like reference numerals identify like elements, and in which.

Figure 1:
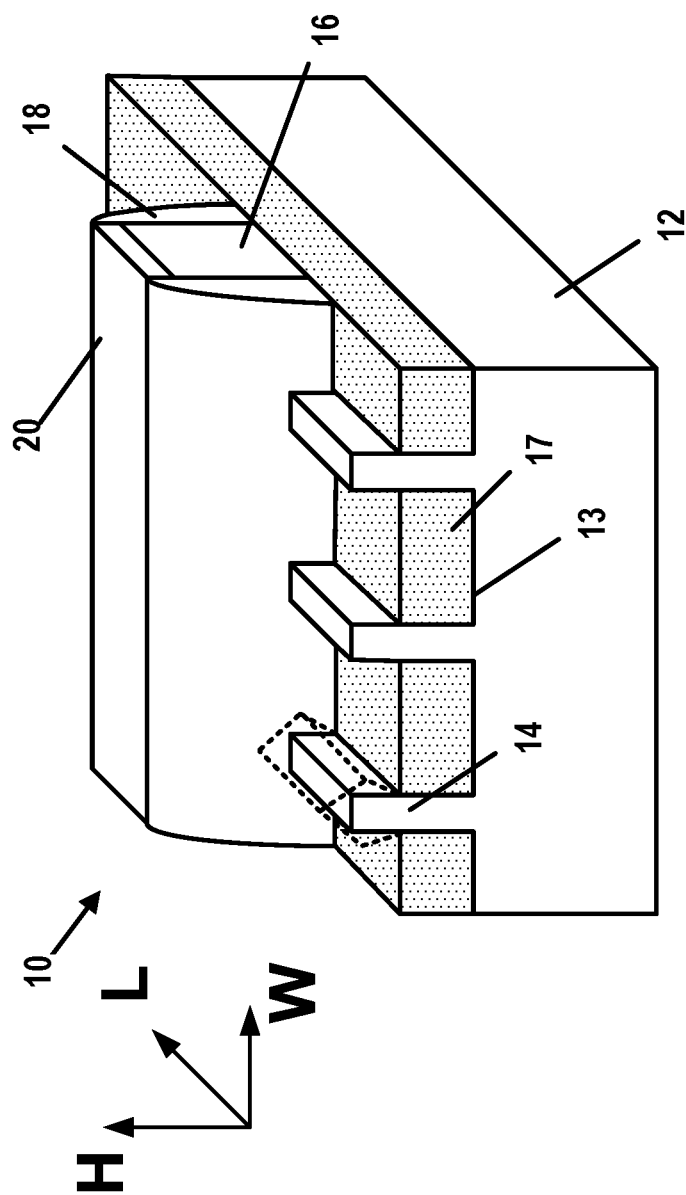
FIG. 1 is a simplistic depiction of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. In the examples depicted herein, the gate structures for the transistor devices will be depicted as being formed using "replacement gate" manufacturing techniques, but such gate structures may also be manufactured using gate-first manufacturing techniques. Of course, the illustrative embodiments of the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2:
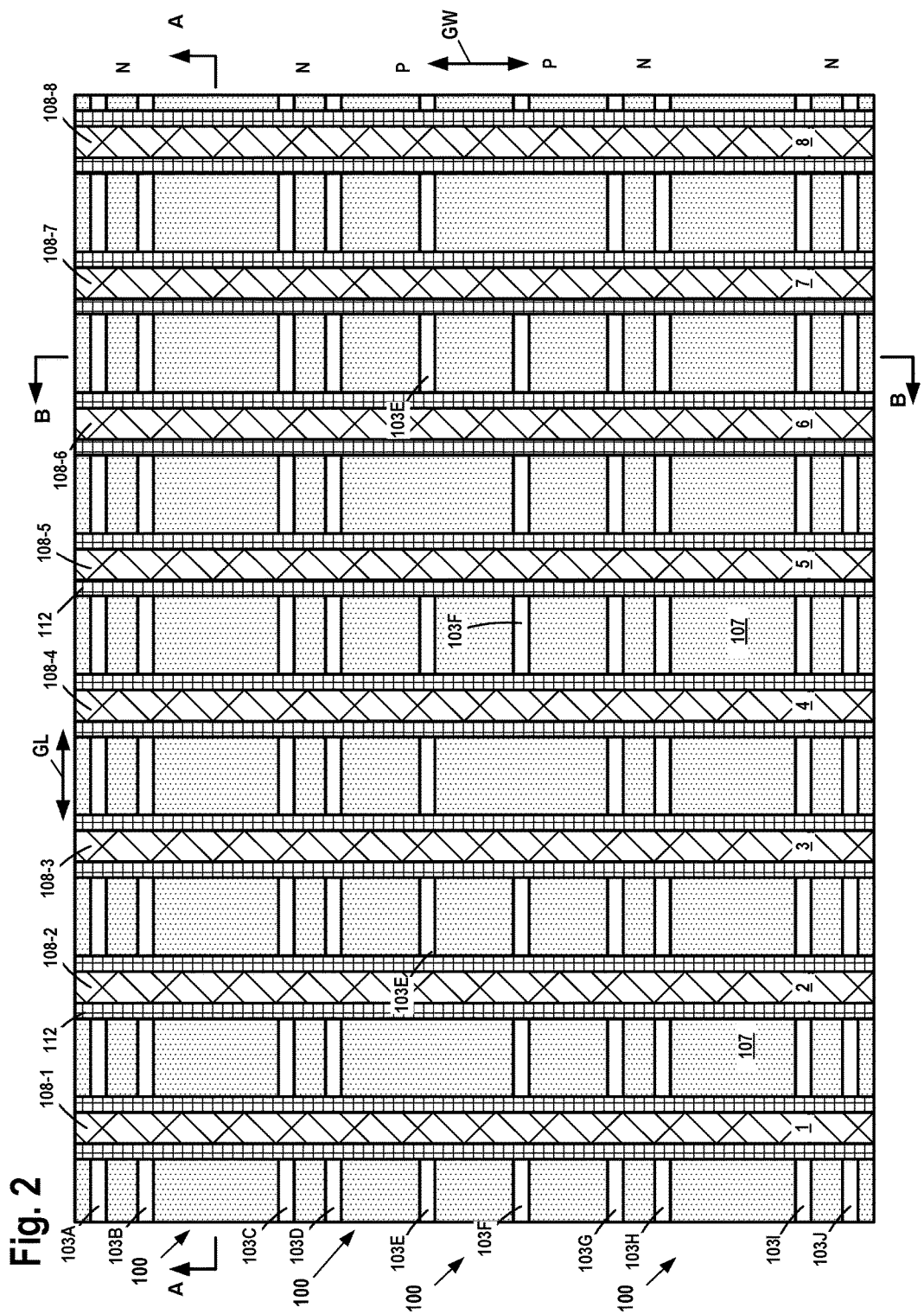
FIGS. 2-23 depict various methods of forming source/drain contact structures on integrated circuit (IC) products and various novel IC products.

FIGS. 2-23 depict various methods of forming source/drain contact structures on integrated circuit (IC) products and various novel IC products 100. FIG. 2 is a simplistic plan view of one illustrative embodiment of an IC product 100 that may be formed using the methods described herein. In the example depicted herein, the IC product is an SRAM memory cell that includes a plurality of FinFET transistor devices. However, the presently disclosed inventions should not be considered to be limited to the formation of SRAM memory cells, or to IC products that include FinFET devices, as the techniques disclosed herein may be employed when forming other IC products that contain different structures and devices. The product 100 comprises a plurality of fins 103A-J (collectively referenced using the numeral 103) and a plurality of gate structures 108-1 through 108-8 (collectively referenced using the numeral 108). The gate structures 108 have also been labeled as gates 1-8 for reference purposes. As depicted, some of the fins 103 have already been cut to have various different axial lengths. Various cross-sectional views of the product 100 (views "A-A" and "B-B") depicted herein are taken where indicated in FIG. 2. More specifically, the view A-A is a cross-sectional view taken between the fins 103B and 103C in a direction corresponding to the gate length (GL) direction of the transistor devices, while the view B-B is a cross-sectional view taken through the fins 103A-J in a direction corresponding to the gate width (GW) direction of the devices. Also depicted in FIG. 2 are the designation for a plurality of N-type devices and P-type devices.

Figure 3:
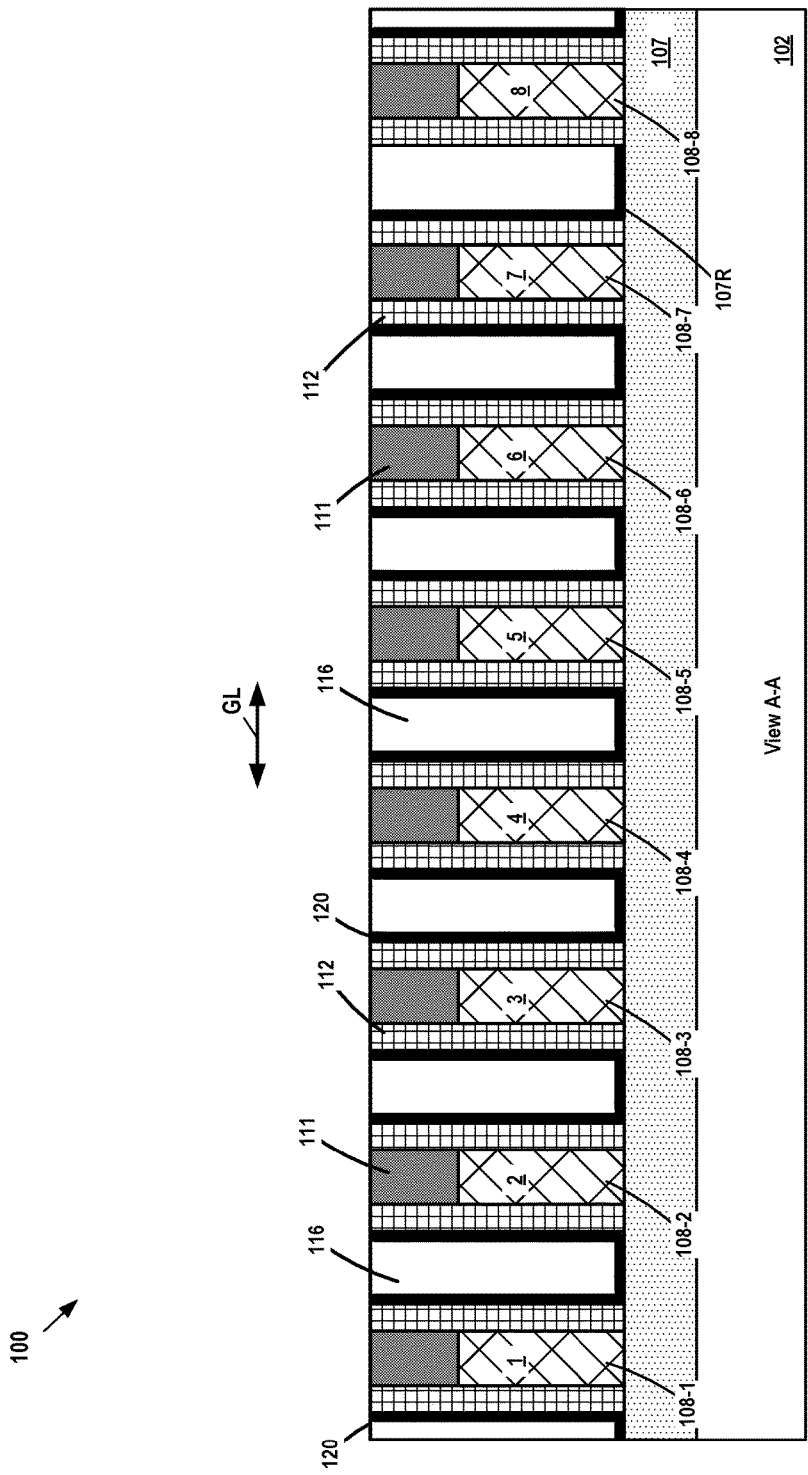
Figure 4:
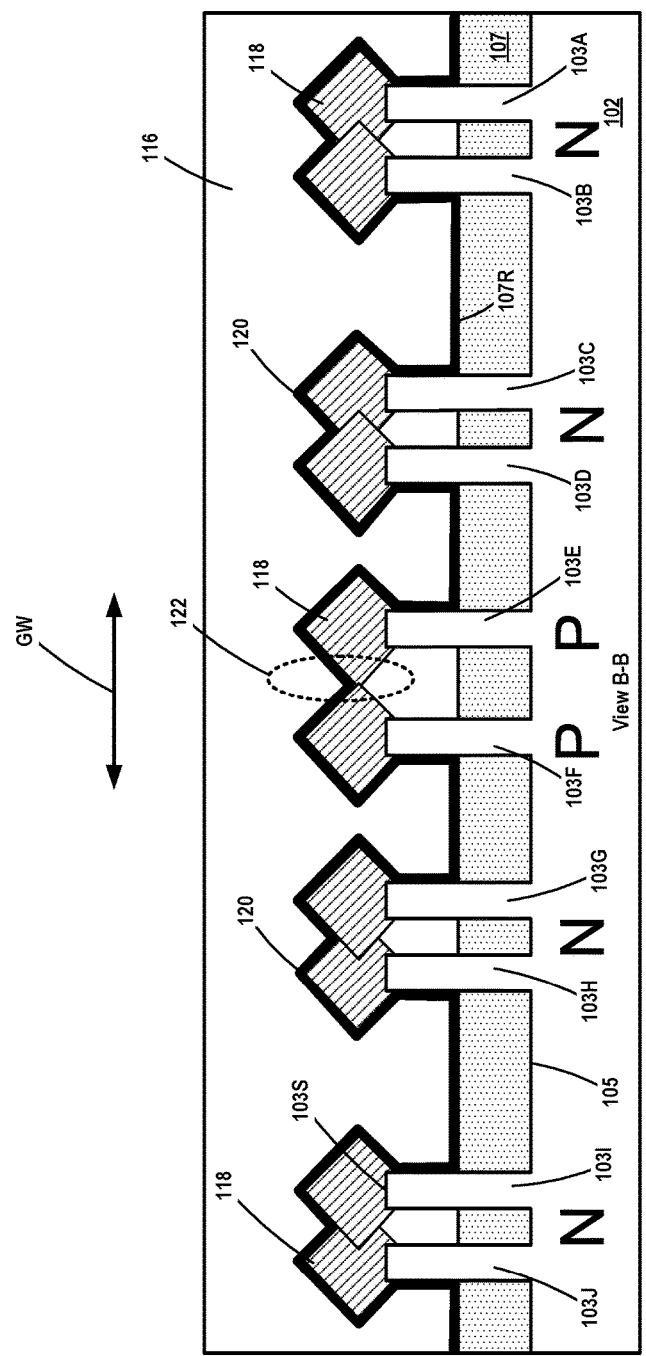

FIGS. 2-4 depict the product 100 after several process operations were performed. The product 100 will be formed on a semiconductor substrate 102 (see FIG. 3 (view A-A)). The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconductor materials and all forms of such materials. Additionally, various doped regions, e.g., halo implant regions, well regions and the like, are not depicted in the attached drawings.

First, with reference to FIG. 4 (view B-B), the fins 103 were formed by performing one or more etching processes, e.g., anisotropic etching processes, through a patterned fin-formation etch mask (not shown) to form a plurality of fin-formation trenches 105 in the substrate 102 and thereby form the plurality of fins 103. The fins 103 have an upper surface 103S. The width and height of the fins 103 may vary depending upon the particular application. Additionally, the overall size, shape and configuration of the fin-formation trenches 105 and fins 103 may vary depending on the particular application. Next, a recessed layer of insulating material 107 (e.g., silicon dioxide) with a recessed upper surface 107R was formed between the fins 103 by performing traditional manufacturing techniques.

With reference to FIG. 3, after the layer of insulating material 107 was recessed, the gate structures 108 and gate caps 111 were formed above the substrate fins 103. So as not to overly complicate the drawings, the gate caps 111 are not shown in FIG. 2. In the example shown herein, the gate structures 108 are sacrificial gate structures. The sacrificial gate structures 108 may be comprised of a variety of different material, e.g., sacrificial gate insulation layer (e.g., silicon dioxide) and a sacrificial gate electrode structure (e.g., amorphous silicon or polysilicon). Next, a sidewall spacer 112 was formed adjacent the gate structures 108. The sidewall spacers 112 were formed by performing a conformal deposition process to form a conformal layer of spacer material on the product 100 and thereafter performing an anisotropic etching process. The spacers 112 may be made from a variety of different materials, e.g., silicon nitride, and the thickness of the spacers 112 (at their base) may vary depending upon the particular application.

Next, as shown in FIG. 4, a plurality of epitaxial deposition processes were performed to form source/drain (S/D) epi semiconductor material 118 on the portions of the fins 103 in the source/drain regions of the devices. The S/D epi semiconductor material 118 may be made of any desired semiconductor material and it may be formed in a doped (in situ doping) or an undoped condition (and later doped via ion implantation). Due to the crystallographic orientation (see FIG. 4) of the material of the substrate 102, the S/D epi semiconductor material 118 has a diamond-like configuration when viewed in a cross-section taken through the S/D epi semiconductor material 118 in a direction corresponding to the gate width (GW) direction of the devices. The amount of the epi semiconductor material that is formed when making the S/D epi semiconductor material 118 may vary depending upon the particular application. As noted above, the S/D epi semiconductor material 118 may be comprised of a variety of different materials depending upon the type of devices under construction. For example, for P-type devices, the S/D epi semiconductor material 118 may be an in situ P-doped (e.g., boron) silicon germanium material. In the situation where the devices are N-type devices, the S/D epi semiconductor material 118 may be an in situ N-doped (e.g., phosphorus) silicon material. So as not to overly complicate the drawings, the S/D epi semiconductor material 118 is not shown in FIG. 2.

Still referencing FIG. 4, after the formation of the S/D epi semiconductor material 118, a conformal deposition process was performed to form a contact etch stop layer (CESL) 120, e.g., silicon nitride, on the product 100. The conformal etch stop layer 120 may be formed to any desired thickness. Thereafter, a layer of insulating material 116, e.g., silicon dioxide, was formed on the product 100 and a CMP process was performed using the gate caps 111 as a polish-stop. So as not to overly complicate the drawings, the CESL 120 and the layer of insulating material 116 are not shown in FIG. 2. As indicated in FIG. 4, during the formation of the S/D epi semiconductor material 118, some of the S/D epi semiconductor material 118 may undesirably contact other portions of the S/D epi semiconductor material 118 formed on other fins 103. In the example shown in FIG. 4, the regions of S/D epi semiconductor material 118 formed on the fins 103E and 103F for the two separate P-type devices impermissibly engage one another in the dashed line region 122. Such engagement is not permitted by the design rules that govern the manufacturing of the IC product 100. Additionally, it must be insured that there is physical separation between the S/D epi semiconductor materials 118 on adjacent N and P type devices so that the devices will function properly.

Figure 5:
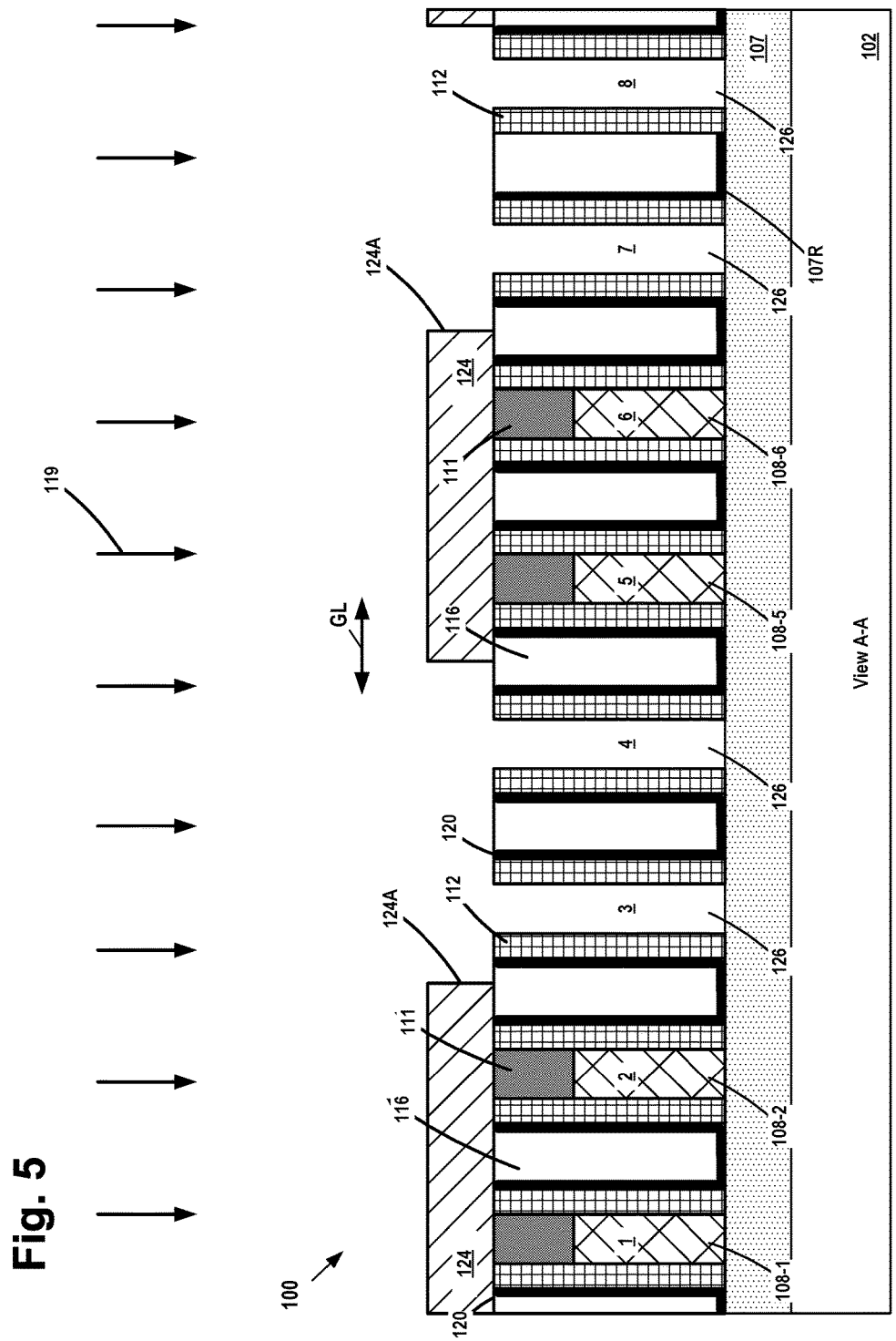
Figure 6:
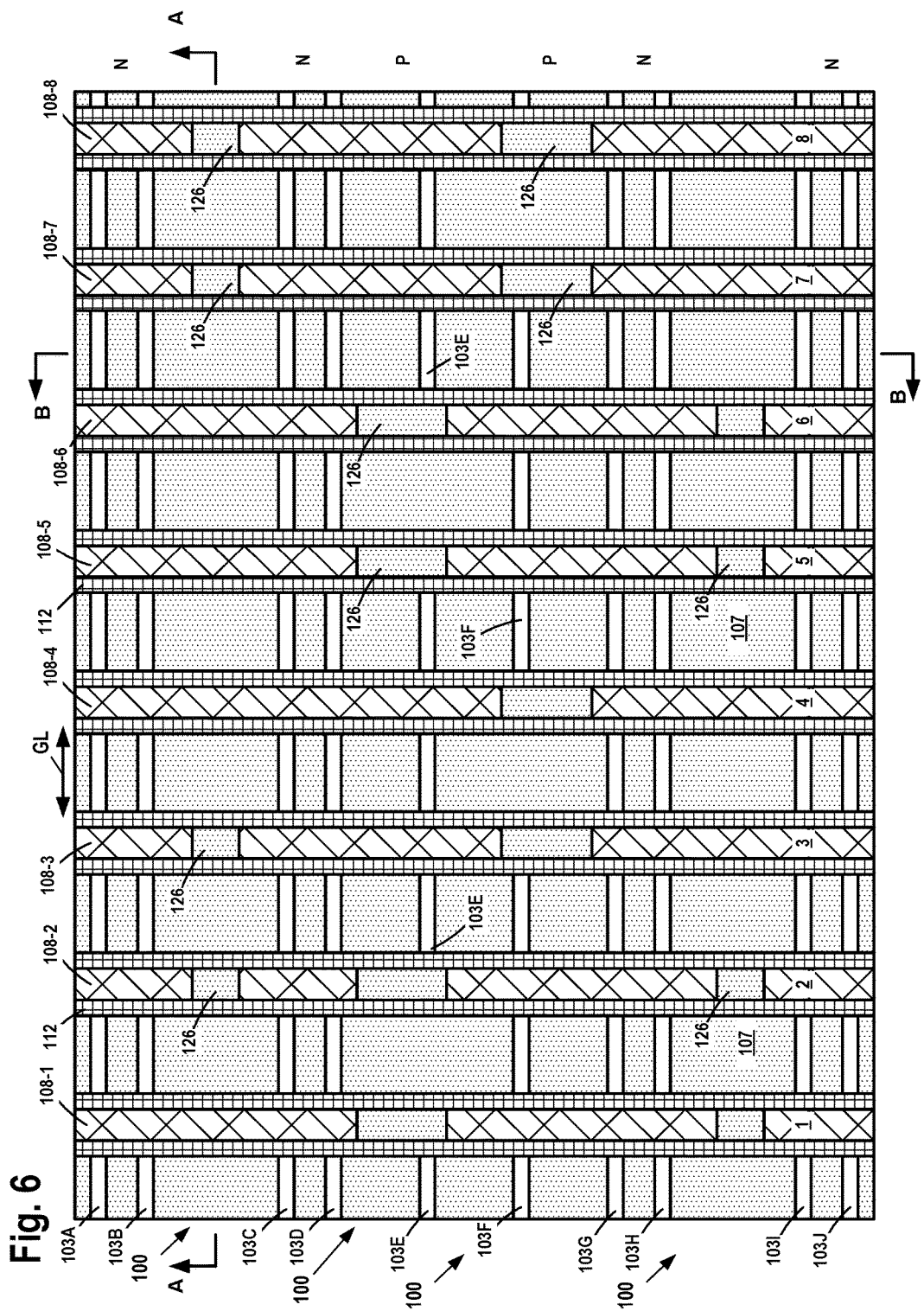

FIGS. 5 (view A-A) and 6 (plan view) depict the product after several process operations were performed to remove portions of the gate caps 111 and to effectively remove or "cut" the gate structures 108 into individual segments of a desired axial length. More specifically, with reference to FIG. 5, a first patterned gate-cut etch mask 124 was initially formed above the product 100. So as not to overly complicate the drawings, the first patterned gate-cut etch mask 124 is not shown in FIG. 6. The first patterned gate-cut etch mask 124 may be comprised of a variety of different materials, e.g., OPL, and it may be formed by depositing the OPL material on the product and thereafter patterning the OPL material using a patterned photoresist etch mask (not shown). The first patterned gate-cut etch mask 124 comprises a plurality of openings 124A that correspond to locations where portions of the underlying gate structures 108 will be removed. In FIG. 5, the openings 124A expose portions of the axial length of gates 3, 4, 7 and 8 that are located above the isolation material 107. Thereafter, one or more etching processes 119 were performed through the first patterned gate-cut etch mask 124 to remove the exposed portions of the gate caps 111 and thereafter the exposed portions of the gate structures 108 selectively relative to the surrounding materials. The etching processes 119 results in the formation of a plurality of gate-cut cavities 126 that are laterally bounded by the spacers 112 along the axial length of gates 3, 4, 7 and 8. Of course, as shown in FIG. 6, several such gate-cut cavities 126 are formed at various locations along the gates 1-8 on the product 100. The gate-cut cavities 126 may have different axial lengths (in the gate width direction) at various locations on the product 100.

In general, in one illustrative process flow, after the formation of gate-cut cavities 126 and removal of the patterned gate-cut etch mask 124, a plurality of contact isolation cavities will be formed on the product at various locations by performing at least one process etching sequence (described below) and thereafter forming an isolation structure in each of the contact isolation openings (as well as the gate-cut cavities 126) by performing various process operations at the same time. In some embodiments, the formation of the contact isolation cavities may involve the formation of multiple patterned etch masks (e.g., 2-5 separate etch masks) and performing the etching process sequence after the formation of each of the patterned etch masks. However, as technology advances, the contact isolation cavities may be formed by forming a single patterned etch mask and performing the process etching sequence only one time. Moreover, in other process flows, the contact isolation cavities may be formed prior to the formation of the gate-cut cavities 126. In the illustrative process flow described below, as part of the process of forming the contact isolation cavities, three illustrative patterned etch masks will be sequentially formed above the product and the etching process sequence will be performed after formation of each of the three patterned etch masks. Of course, as mentioned above, the presently disclosed inventions should not be considered to be limited to the illustrative process flow depicted herein that involves formation of the illustrative three patterned etch masks.

Figure 7:
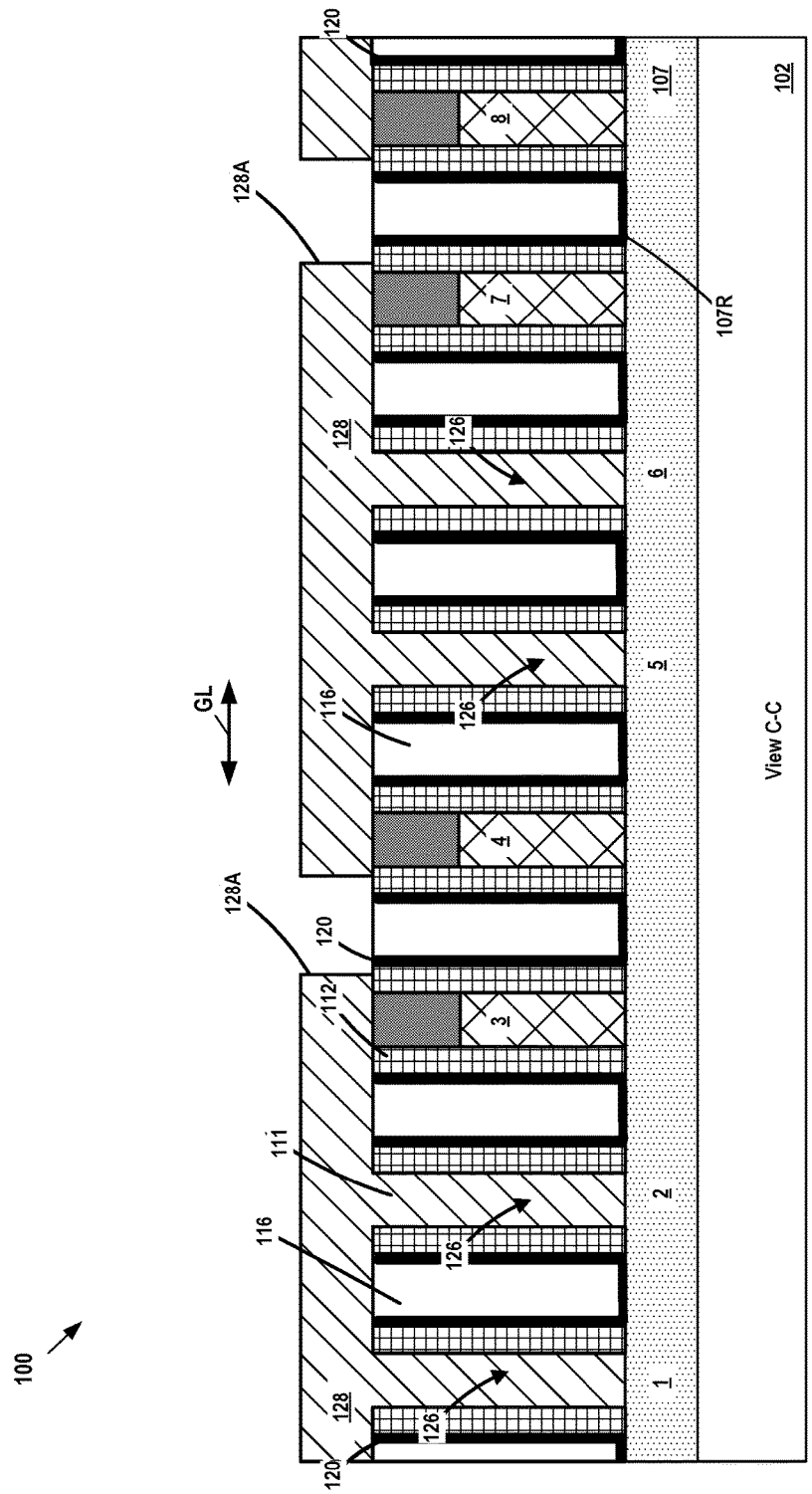
Figure 9:
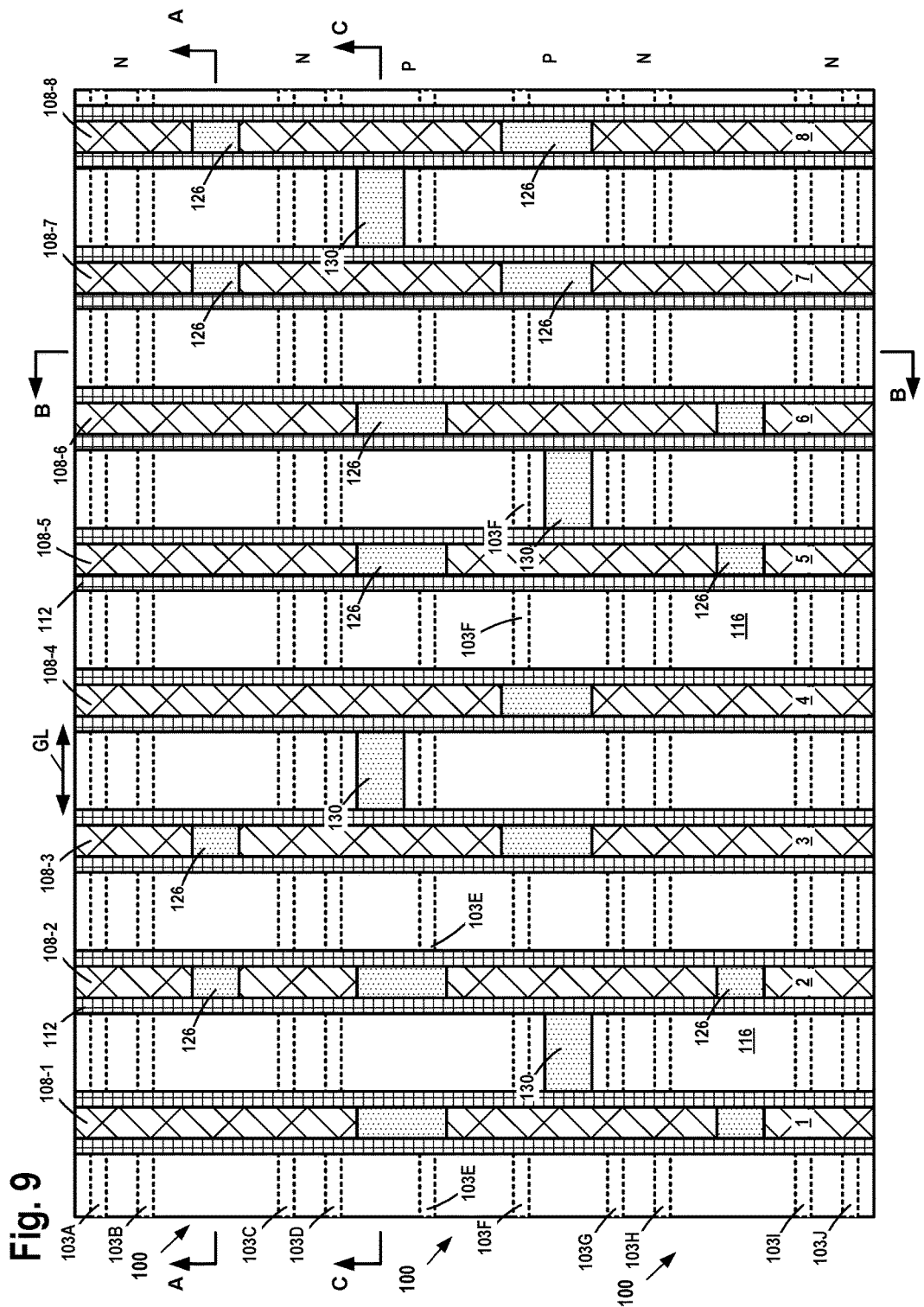

Accordingly, FIGS. 7 (view C-C), 8 (view C-C) and 9 (plan view) depict the product after several process operations were performed. As indicated in FIG. 9, the view C-C is a cross-sectional view taken between the fins 103D and 103E and through the gate structures 108 in a direction corresponding to the gate length direction of the transistor devices. First, the first patterned gate-cut etch mask 124 was removed. Thereafter, with reference to FIG. 7, a second patterned etch mask 128 was formed above the product 100. The second patterned etch mask 128 may be comprised of the same materials and formed in the same manner as that described above for the first patterned gate-cut etch mask 124. So as not to overly complicate the drawings, the second patterned etch mask 128 is not shown in FIG. 9. The second patterned etch mask 128 comprises a plurality of openings 128A that correspond to locations where portions of the layer of insulating material 116, the CESL 120 and any portions of S/D epi semiconductor material 118 that is (or may be) located under the openings 128A may be removed. Note that, as shown in FIG. 7, the second patterned etch mask 128 fills the previously formed gate-cut cavities 126 that were formed in gates 1, 2, 5 and 6. In FIG. 7, the openings 128A are located above the isolation material 107 between gates 3 and 4 and gates 7 and 8.

Figure 8:
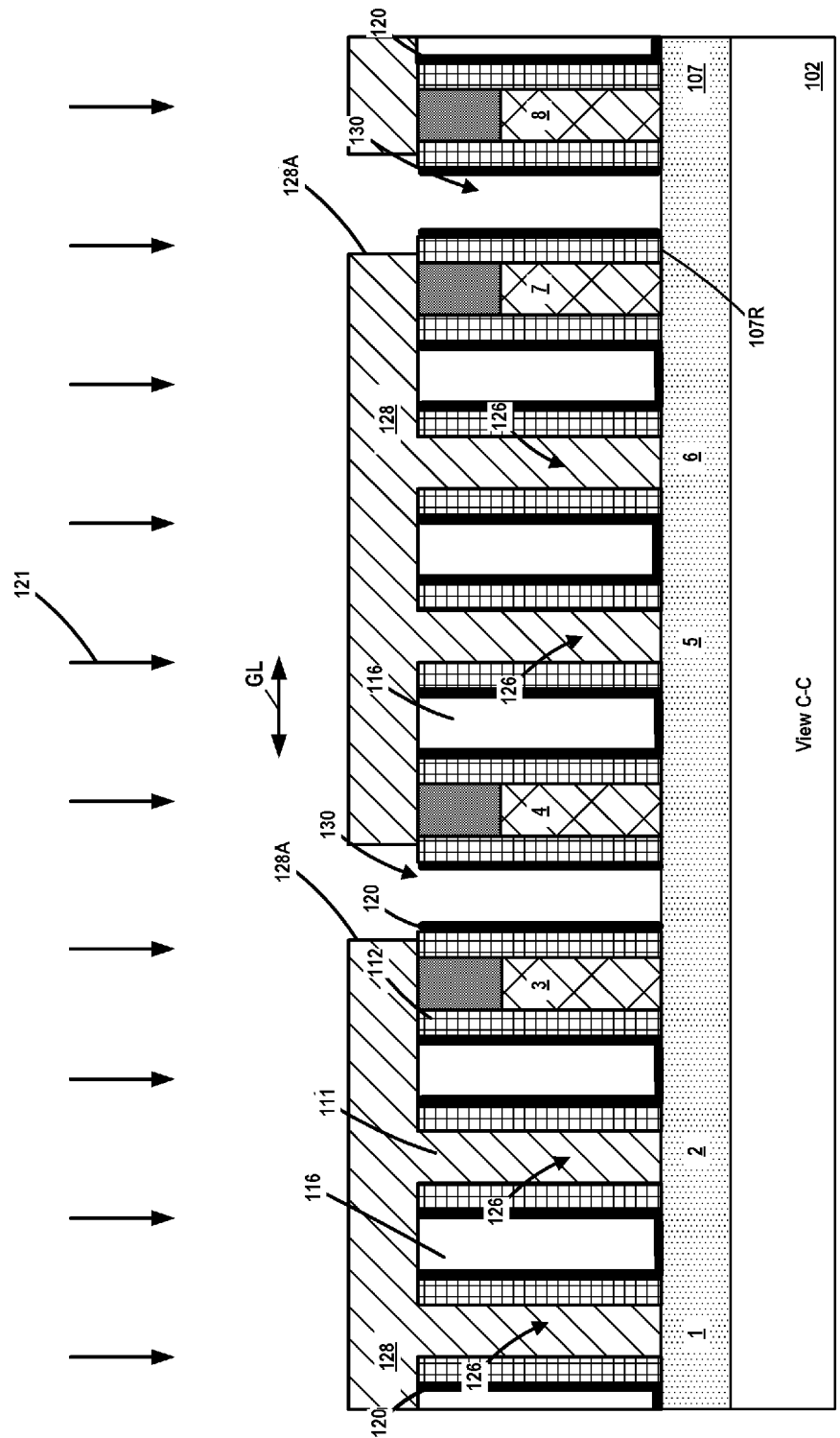

Thereafter, with reference to FIGS. 8 and 9, an etching process sequence 121 was performed through the second patterned etch mask 128 to sequentially remove (selectively relative to surrounding materials) exposed portions of the layer of insulating material 116, thereafter exposed portions of the CESL 120 and, if present, portions of the S/D epi semiconductor material 118 exposed by removal of the CESL 120. In one illustrative process flow, the etching process sequence 121 comprises a first anisotropic etching process that is adapted to remove the layer of insulating material 116 selectively relative to the surrounding materials. In one illustrative embodiment, this first anisotropic etching process stops on the CESL layer 120. Thereafter, in one illustrative process flow, the etching process sequence 121 comprises a second anisotropic etching process that is adapted to remove the CESL 120 selectively relative to the surrounding materials. Next, in one illustrative process flow, the etching process sequence 121 comprises a third isotropic etching process that is adapted to selectively remove any exposed portions (if present) of the S/D epi semiconductor material 118 exposed by the removal of the CESL 120.

At the conclusion of the etching process sequence 121, a plurality of first contact isolation cavities 130 are formed at selected locations across the product 100. In the case where the CESL 120 is positioned on S/D epi semiconductor material 118, removal of the CESL 120 would expose portions of the underlying S/D epi semiconductor material 118. In cases where there is no S/D epi semiconductor material 118 present under the removed portion of the CESL 120, the second anisotropic etching process will expose portions of the underlying layer of insulating material 116. The third isotropic etching process is not designed to significantly attack either the CESL 120 or the layer of insulating material 116. Thus, if there is no S/D epi semiconductor material 118 located under the removed portions of the CESL 120, the depth of the first contact isolation cavities 130 will not be increased by any appreciable extent. At the conclusion of the third etching process, if desired, a brief etching process that is adapted to remove the insulating material 116 may be performed to further extend the depth of the first contact isolation cavities 130 by removing portions of the layer of insulating material 116 selectively relative to surrounding materials. Of course, as shown in FIG. 9, several such first contact isolation cavities 130 are formed at various locations on the product 100. The first contact isolation cavities 130 may have different axial lengths (in the gate width direction) at various locations on the product 100.

Figure 10:
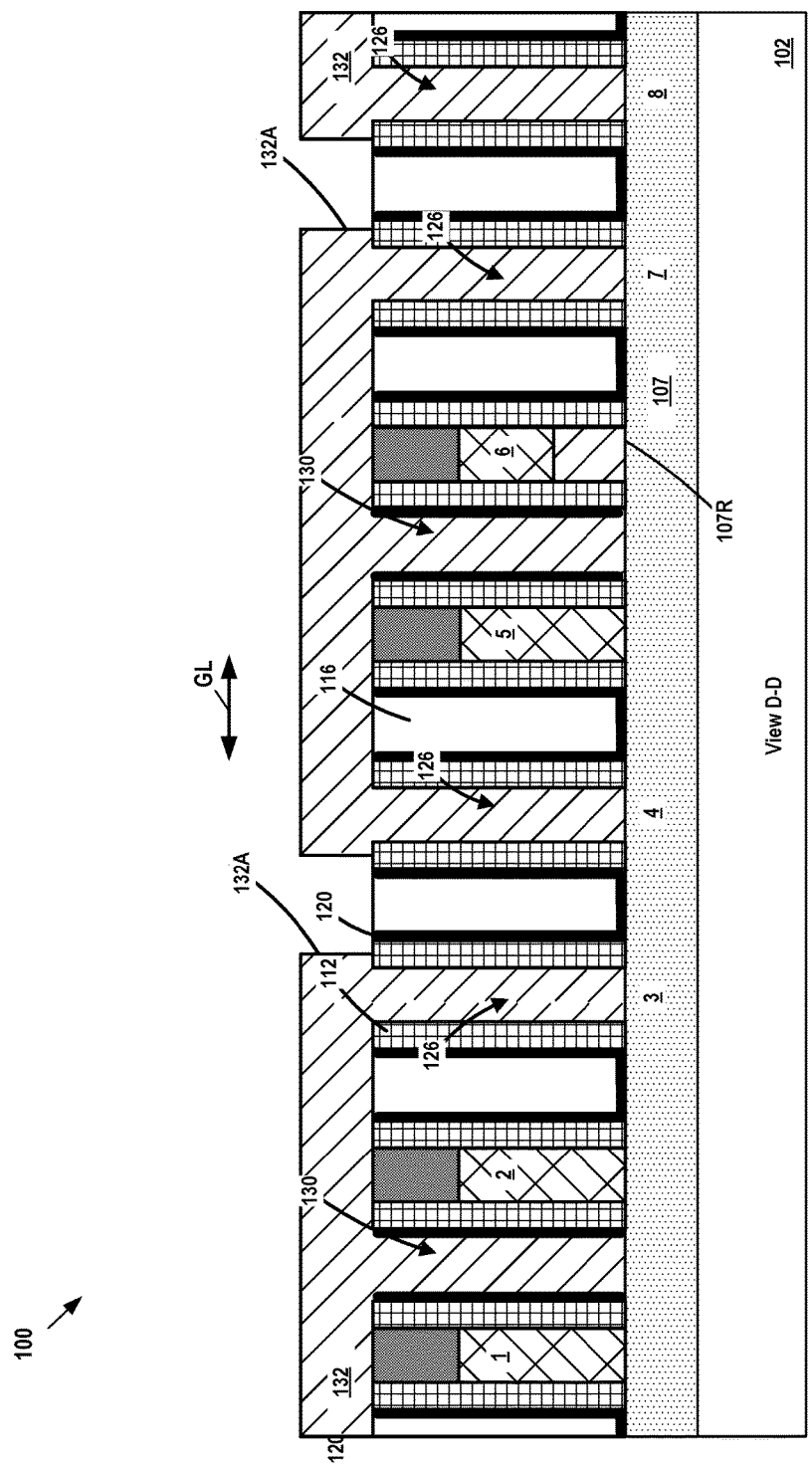
Figure 12:
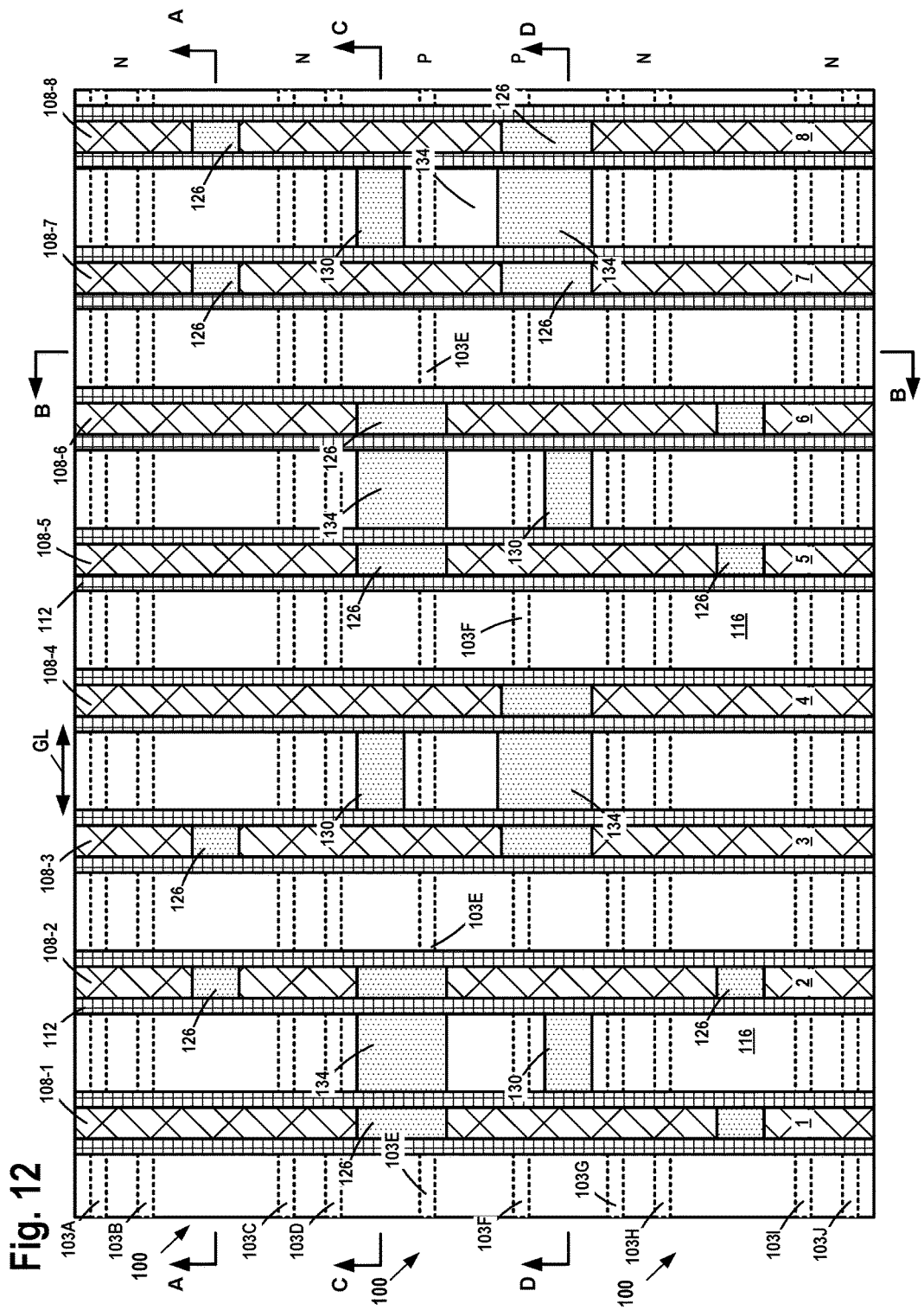

FIGS. 10 (view D-D), 11 (view D-D) and 12 (plan view) depict the product after several process operations were performed. As indicated in FIG. 12, the view D-D is a cross-sectional view taken between the fins 103F and 103G and through the gate structures 108 in a direction corresponding to the gate length direction of the transistor devices. First, the second patterned etch mask 128 was removed. Thereafter, with reference to FIG. 10, a third patterned etch mask 132 was formed above the product 100. The third patterned etch mask 132 may be comprised of the same materials and formed in the same manner as that described above for the first patterned gate-cut etch mask 124. So as not to overly complicate the drawings, the third patterned etch mask 132 is not shown in FIG. 12. The third patterned etch mask 132 comprises a plurality of openings 132A that correspond to locations where portions of the layer of insulating material 116, the CESL 120 and any portions (if any) of S/D epi semiconductor material 118 that are located under the openings 132A may be removed. Note that, as shown in FIG. 10, the third patterned etch mask 132 fills the previously formed gate-cut cavities 126 and first contact isolation cavities 130 across the product 100. In FIG. 10, the openings 132A are located above portions of the isolation material 107.

Figure 11:
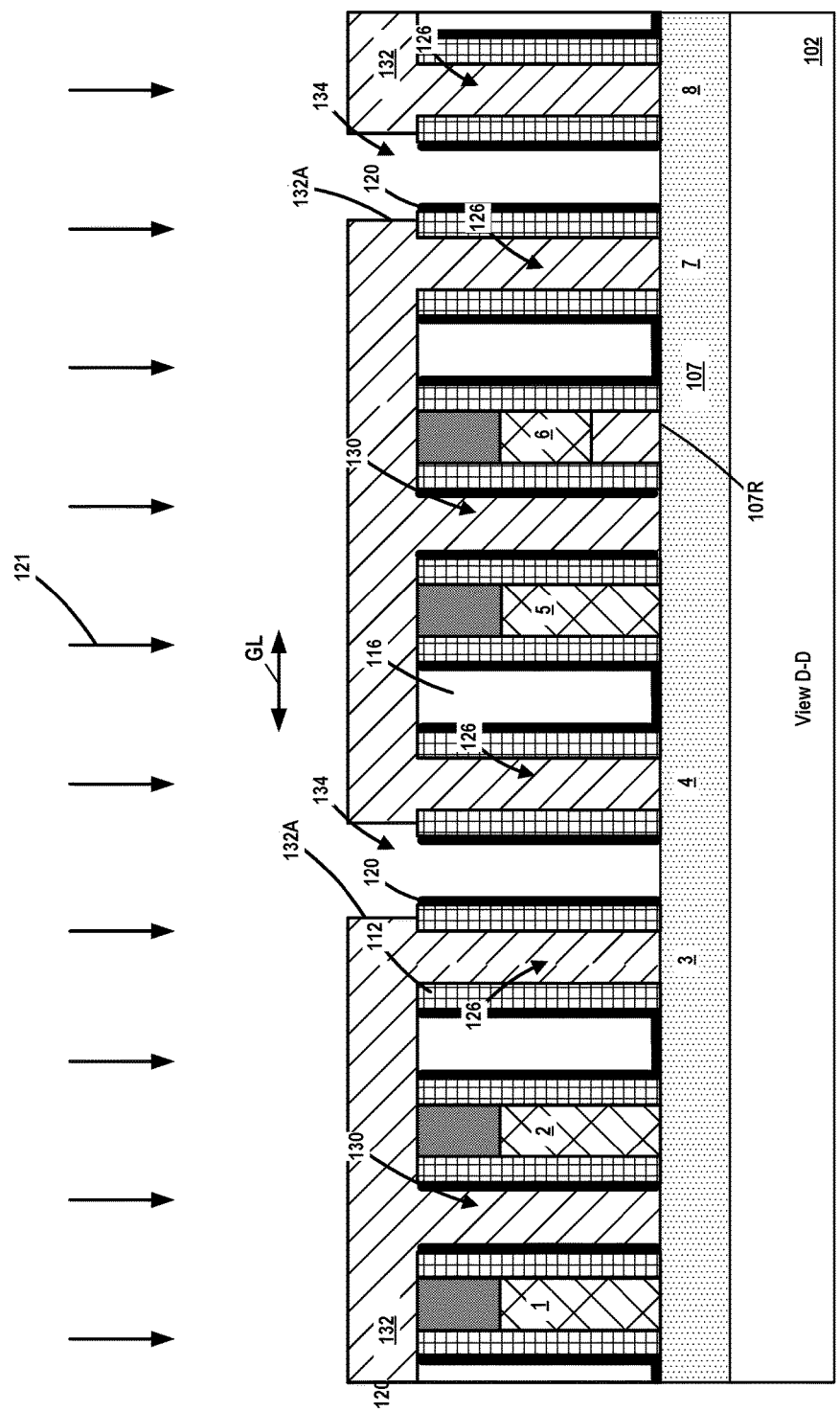

Thereafter, with reference to FIGS. 11 and 12, the above-described etching process sequence 121 was performed through the third patterned etch mask 132 to sequentially remove exposed portions of the layer of insulating material 116, thereafter exposed portions of the CESL 120 and, if present, portions of the S/D epi semiconductor material 118 positioned under the openings 132A that were exposed by removal of the CESL 120. After the second performance of the etching process sequence 121, a plurality of second contact isolation cavities 134 are formed at selected locations across the product 100. In the depicted example, formation of the second contact isolation cavities 134 exposes portions of the isolation material 107. Of course, as shown in FIG. 12, several second contact isolation cavities 134 are formed at various locations on the product 100. The second contact isolation cavities 134 may have different axial lengths (in the gate width direction) at various locations on the product 100.

Figure 13:
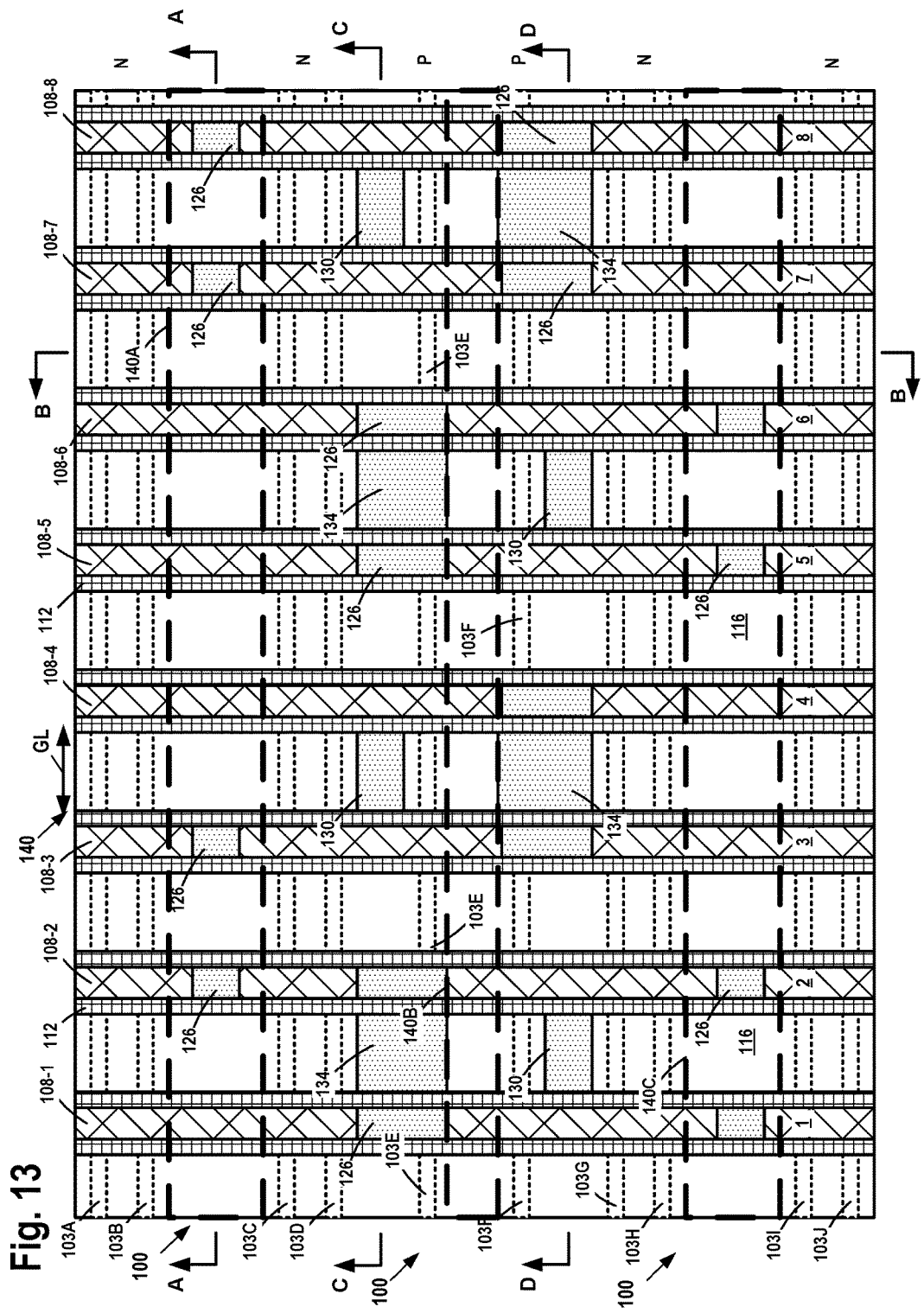
Figure 14:
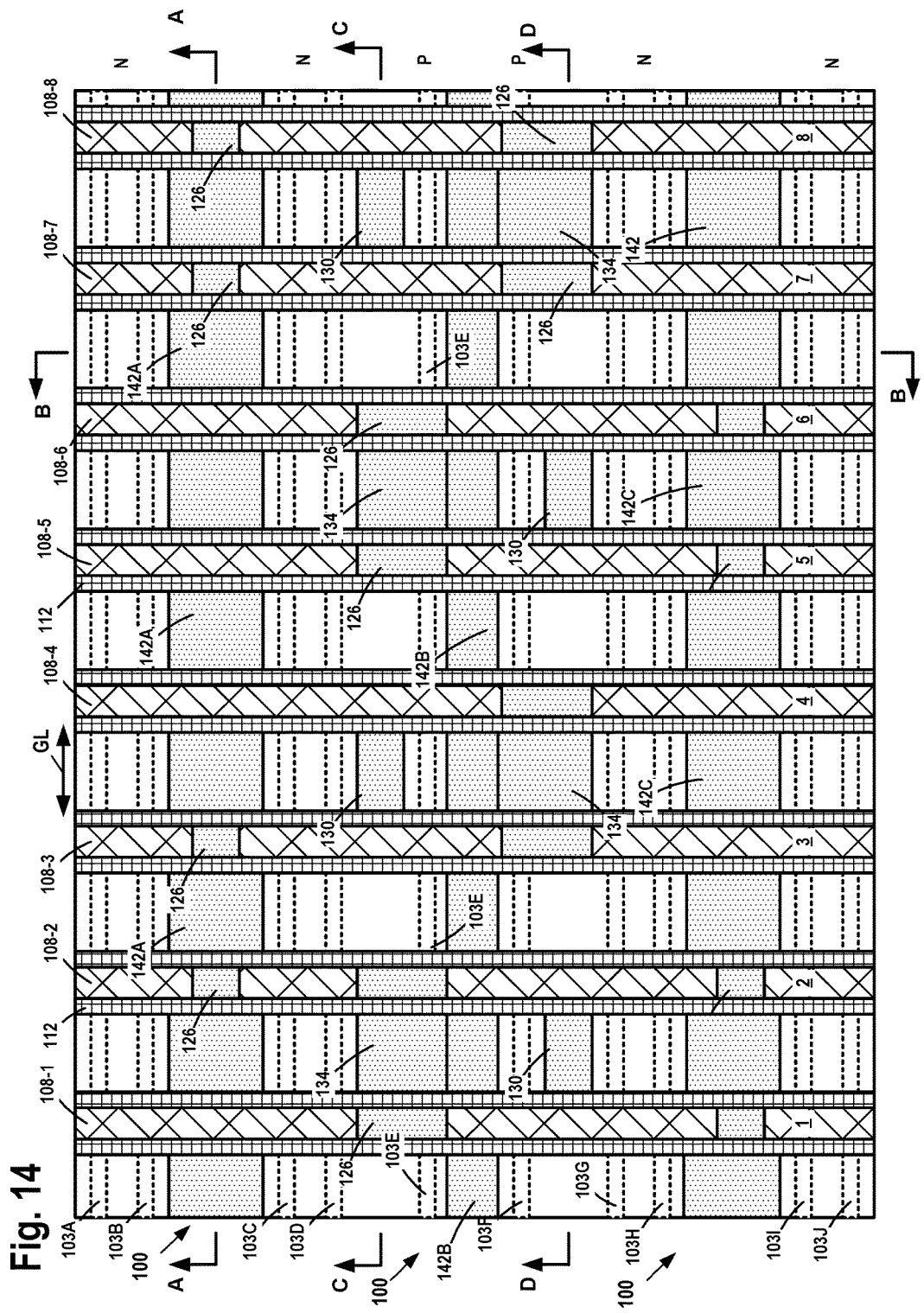

FIGS. 13 (plan view) and 14 (plan view) depict the product after several process operations were performed. First, the third patterned etch mask 132 was removed. Thereafter, with reference to FIG. 13, a fourth patterned etch mask 140 with a plurality of openings 140A, 140B and 140C formed therein was formed above the product 100. So as not to overly complicate the drawings, the actual layer of material for the fourth patterned etch mask 140 is not shown in FIG. 13. The opening 140A is positioned above the isolation material 107 between fins 103B and 103C, the opening 140B is positioned above the isolation material 107 between fins 103E and 103F and the opening 140C is positioned above the isolation material 107 between fins 103H and 103I. The fourth patterned etch mask 140 may be comprised of the same materials and formed in the same manner as that described above for the first patterned gate-cut etch mask 124. As before, the openings in the fourth patterned etch mask 140 correspond to locations where portions of the layer of insulating material 116, the CESL 120 and any portions of S/D epi semiconductor material 118 that may be located under the openings 140A, 140B and 140C may be removed. Also note that, like before, the fourth patterned etch mask 140 fills the previously formed gate-cut cavities 126 and the contact isolation cavities 130 and 134 across the product 100. Thereafter, with reference to FIGS. 13 and 14, the above-described etching process sequence 121 was again performed through the fourth patterned etch mask 140 to sequentially remove exposed portions of the layer of insulating material 116, thereafter exposed portions of the CESL 120 and, if present, portions of the S/D epi semiconductor material 118 positioned under the openings 140A, 140B and 140C and exposed by removal of the CESL 120. At the conclusion of this third performance of the etching process sequence 121, a plurality of third contact isolation cavities 142A, 142B, 142C (see FIG. 14—collectively referenced using the numeral 142) are formed at selected locations across the product 100. In the depicted example, formation of the third contact isolation cavities 142 exposes portions of the isolation material 107. The third contact isolation cavities 142 may have different dimensions (in the gate width direction). FIG. 14 depicts the product 100 after the fourth patterned etch mask 140 was removed.

Figure 15:
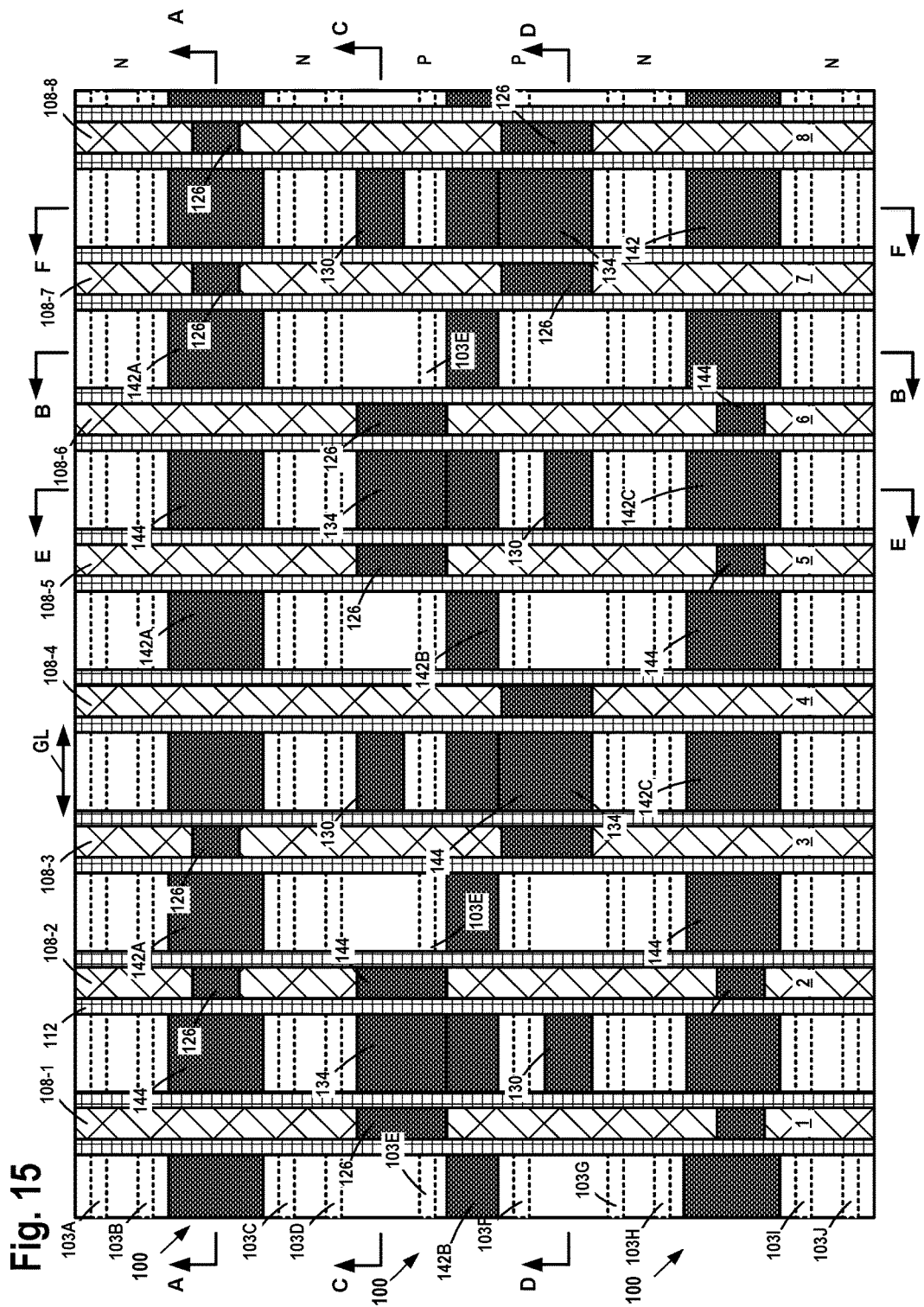
Figure 16:
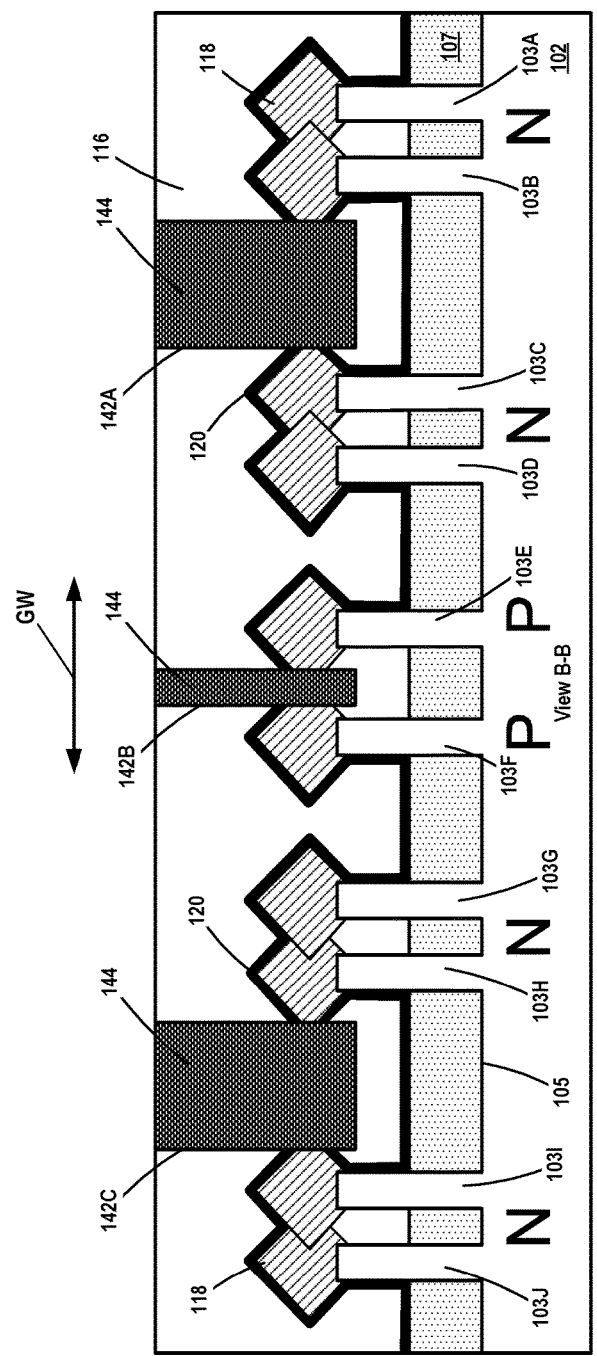
Figure 17:
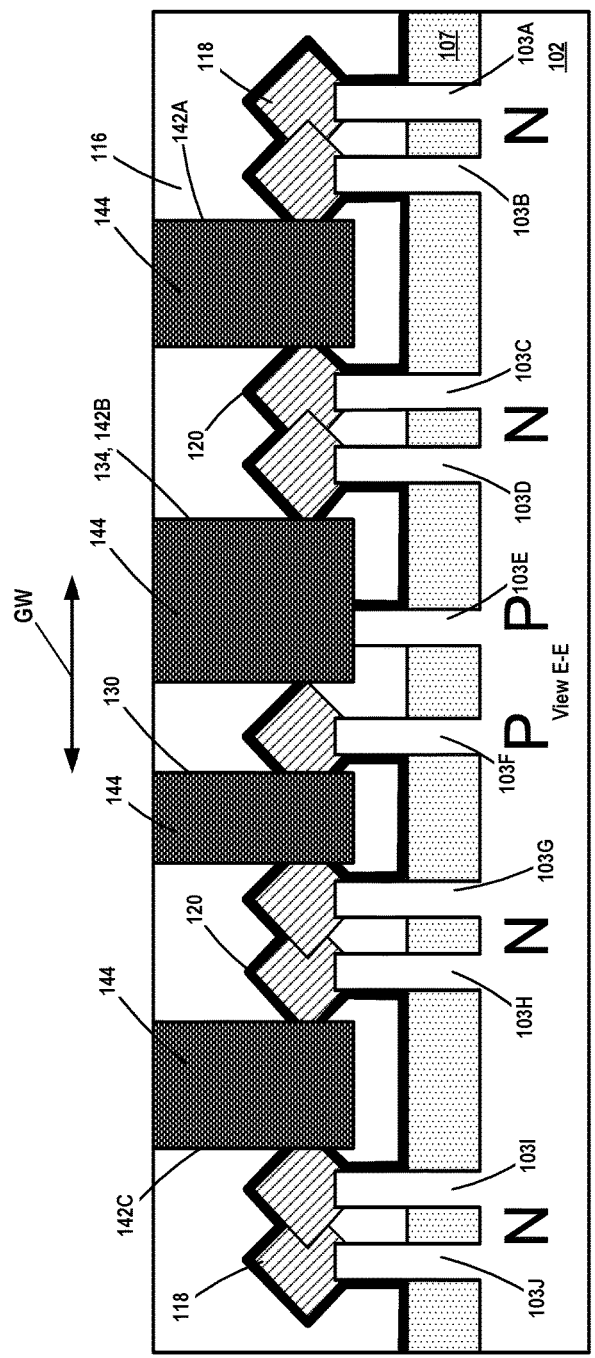
Figure 18:
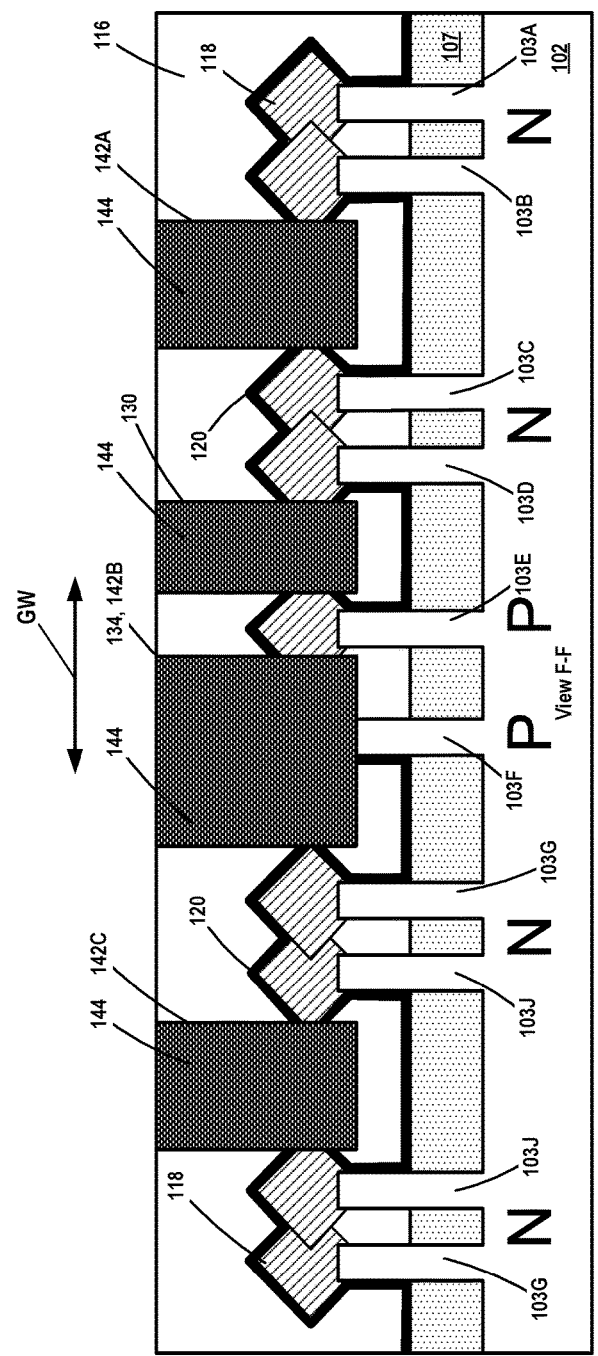

At this point in the process flow, the gate-cut cavities 126 as well as the contact isolation cavities 130, 134, 142 are ready to be filled with an isolation material. Accordingly, FIGS. 15 (plan view), 16 (view B-B), 17 (view E-E) and 18 (view F-F) depict the product after several process operations were performed. As indicated in FIG. 15, the view B-B is a cross-sectional view taken through the fins 103A-J between gates 6 and 7 in a direction corresponding to the gate width (GW) direction of the devices, the view E-E is a cross-sectional view taken through the fins 103A-J between gates 5 and 6 in a direction corresponding to the gate width (GW) direction of the devices, and the view F-F is a cross-sectional view taken through the fins 103A-J between gates 7 and 8 in a direction corresponding to the gate width (GW) direction of the devices.

With reference to FIGS. 15-18, a deposition process was performed so as to over-fill the gate-cut cavities 126 and the contact isolation cavities 130, 134, 142 with an isolation material 144. Thereafter, a CMP process was performed using the gate caps 111 and the upper surface of the insulating material 116 as a polish-stop so as to thereby remove excess amounts of the isolation material 144. The isolation material 144 remaining in the contact isolation cavities 130, 134, 142 constitutes contact isolation structures or pillars. The isolation material 144 may be comprised of a variety of different materials. In general, the isolation material should be a material that permits the selective removal (by etching) of the layer of insulating material 116 relative to the isolation material 144, selective removal (by etching) of the gate caps 111 relative to the isolation material 144 (for a replacement gate manufacturing process) and selective removal of the sacrificial gate structures 108 relative to the isolation material 144. In one illustrate embodiment, the isolation material 144 may be silicon nitride or a low-k material (k value less than about 3.8), SiOC, etc.

Figure 19:
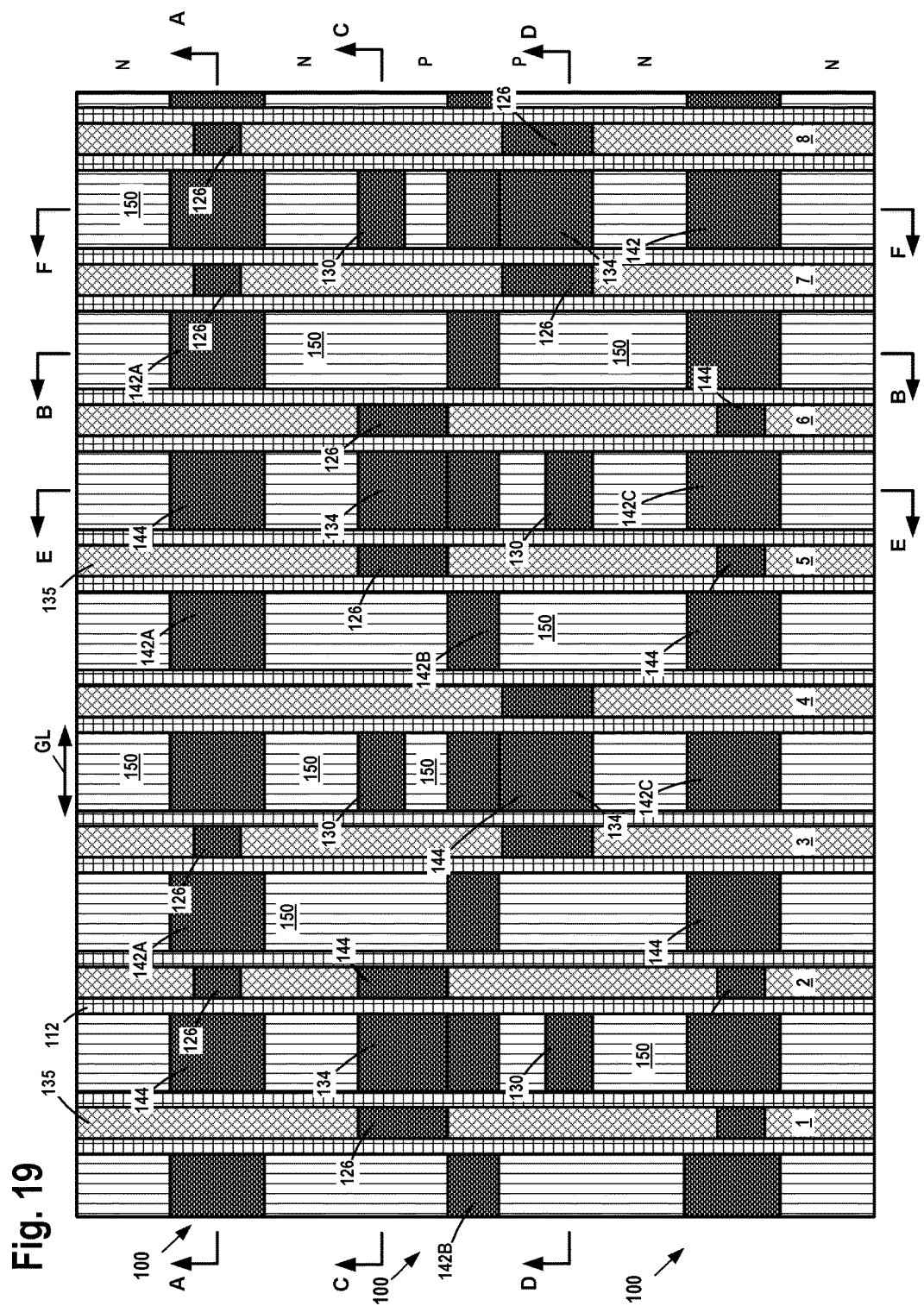
Figure 20:
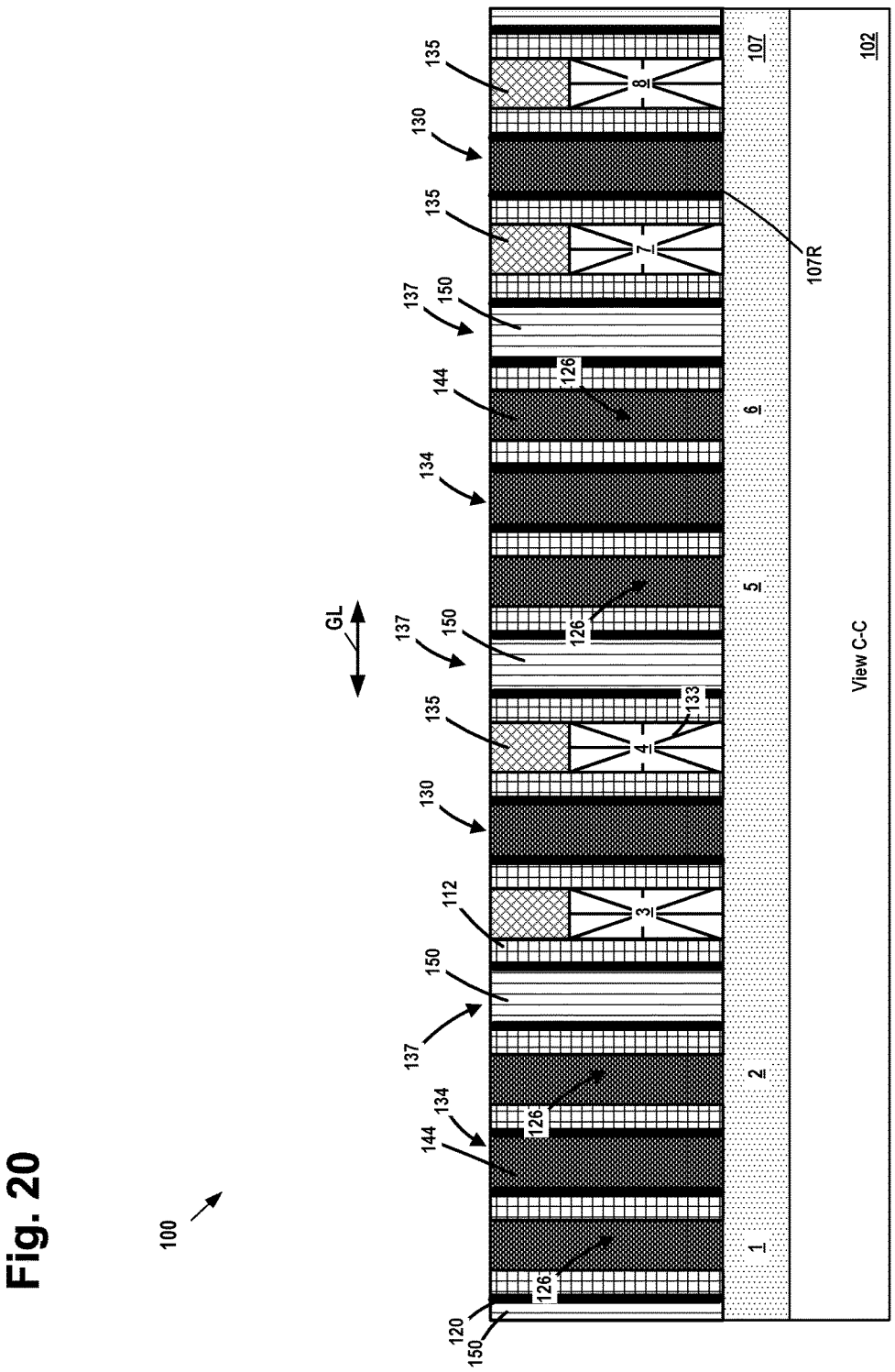

FIGS. 19 (plan view), 20 (view C-C), 21 (view B-B), 22 (view E-E) and 23 (view F-F) depict the product after several process operations were performed. First, in one illustrative process flow, traditional replacement gate manufacturing processes were performed to remove the gate caps 111 and the sacrificial gate structures 108 so as to form replacement gate cavities between the spacers 112. The gate caps 111 were selectively etched relative to the surrounding materials, e.g., the spacers 112, the isolation material 144, the insulating material 116, etc. Thereafter, the materials for the final gate structures 133 (see FIG. 20) were formed in the gate cavities. Such materials for the final gate structures 133 may include a layer of high-k (k value greater than 10—not separately shown) gate insulation material and one or more layers of conductive material (not separately shown) that will function as the gate electrode in the final gate structure 133. Then, a recess etching process was performed to recess the materials of the final gate structure 133 to make room for the final gate caps 135 (see FIG. 20). The final gate caps 135 were formed by depositing the material of the final gate caps 135, e.g., silicon nitride, and then performing a CMP process to remove excess amounts of the final gate cap material using the layer of insulation 116 as a polish stop.

After formation of the final gate caps 135, a first etching process was performed to remove vertical portions of the layer of insulating material 116 selectively relative to the surrounding materials, e.g., the contact isolation structures or pillars (comprised of the isolation material 144) that were formed in the contact isolation cavities 130, 134, 142, the gate isolation pillars (comprised of the isolation material 144) that were formed in the gate-cut cavities 126, the spacers 112 and CESL 120. This first etching process stops on the CESL 120. Thereafter, another etching process was performed to remove the exposed portions of the CESL 120 relative to the surrounding materials and particularly relative to the S/D epi semiconductor material 118. These process operations form a plurality of source/drain contact openings 137 that are bounded at least in the gate width direction (see, e.g., FIGS. 21-23) by the contact isolation pillars formed in the contact isolation cavities 130, 134, 142. This second etching process exposes at least portions of the S/D epi semiconductor material 118 within each of the contact openings 137.

Figure 21:
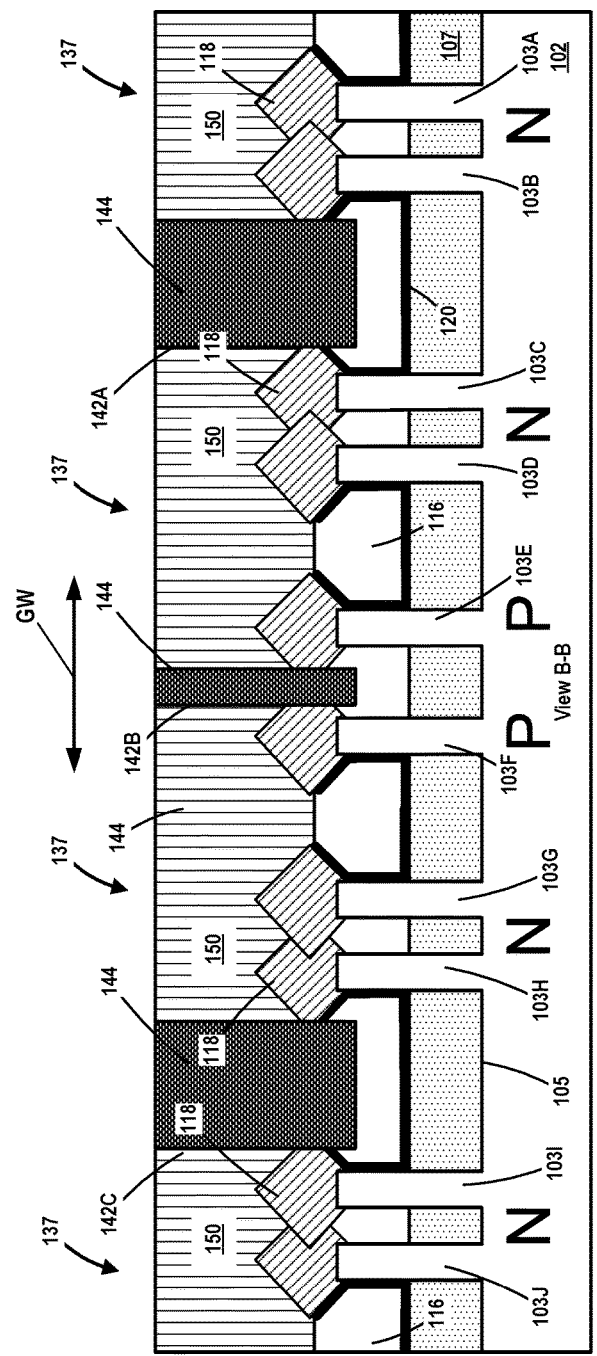
Figure 22:
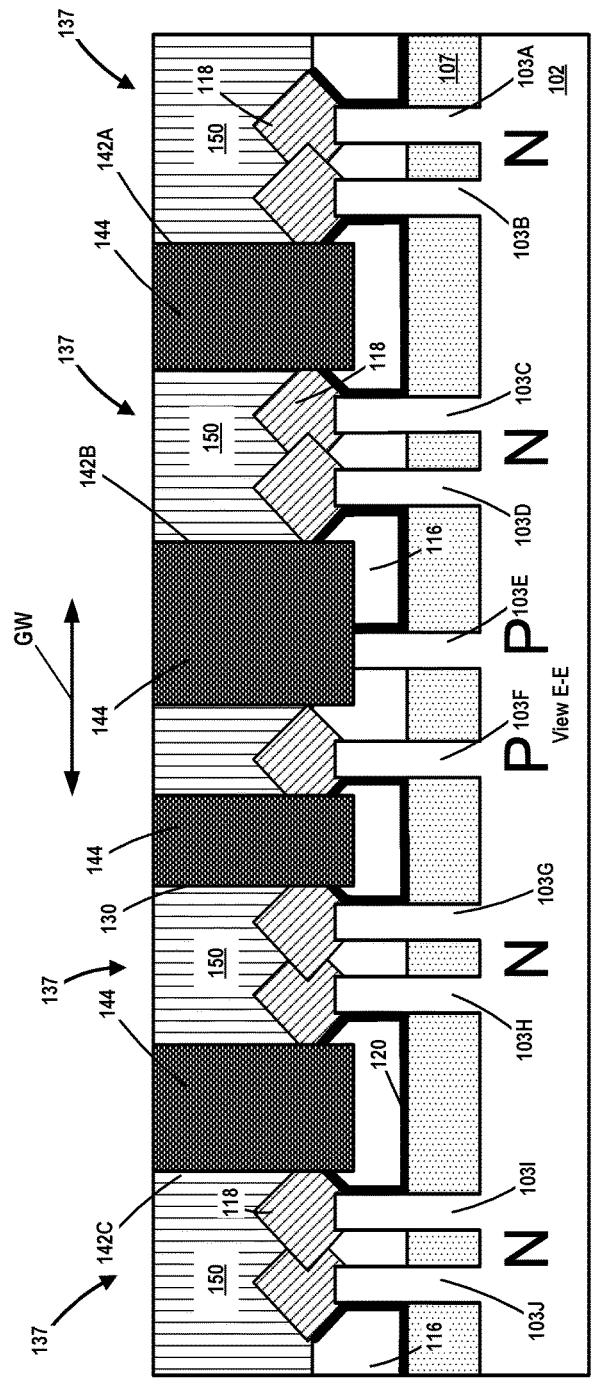
Figure 23:
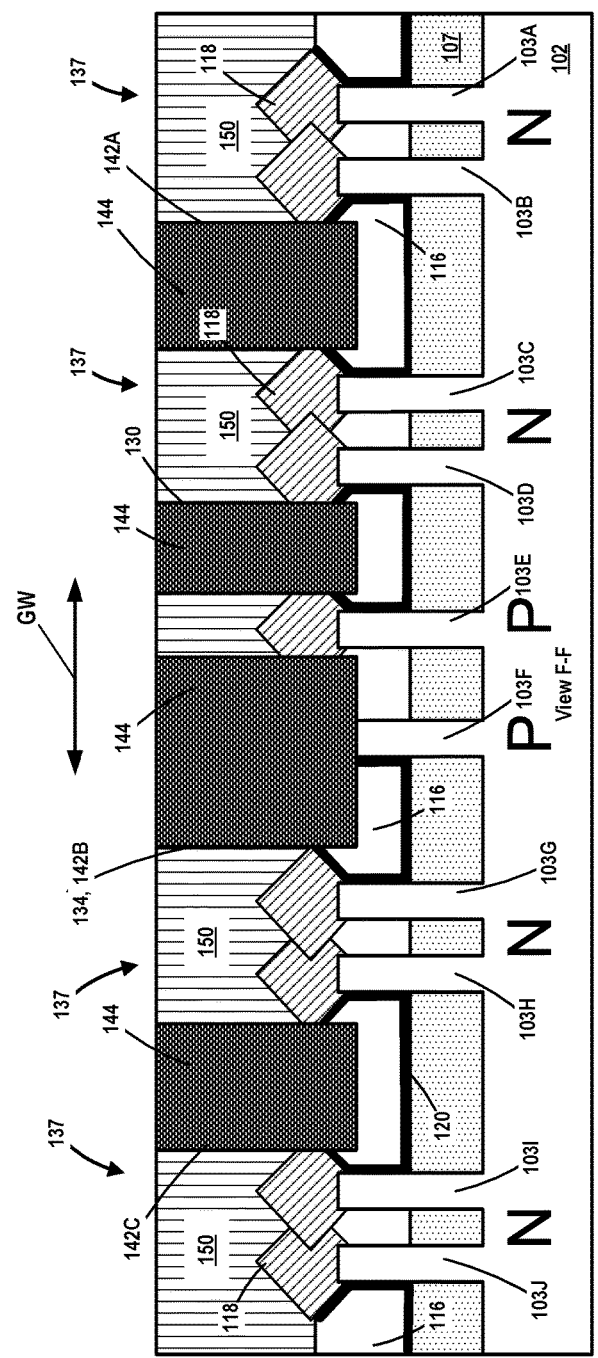

Next, traditional manufacturing operations were performed to form illustrative conductive source/drain metallization structures 150, e.g., trench silicide containing regions, in the contact openings 137 so as to conductively contact the exposed portions of the S/D epi semiconductor material 118, i.e., so as to conductively contact the source/drain regions of the devices. The conductive source/drain metallization structures 150 will eventually be conductively coupled to other contact structures (not shown) that are to be subsequently formed on the product 100. The configuration and structure of the conductive source/drain metallization structures 150 may vary depending upon the particular application. In one example, the conductive source/drain metallization structures 150 are line-type structures that extend in the gate width (GW) direction of the devices for substantially the entire length of the active region. In some cases, the conductive source/drain metallization structures 150 comprise a metal silicide material and one or more additional metal materials, such as tungsten (not separately shown). After the formation of the materials that make up the conductive source/drain metallization structures 150, a chemical mechanical polishing (CMP) process was performed to remove excess materials located above the gate caps 135 and the contact isolation pillars that are comprised of the material 144. As depicted in FIGS. 21-23, the conductive source/drain metallization structures 150 are bounded by (in the gate width direction) and abut the contact isolation pillars comprised of the isolation material 144.

As will be appreciated by those skilled in the art after a complete reading of the present application, the various etching processes and various patterned etch masks may be formed in any desired sequential order. For example, in the depicted example, the gate-cut cavities 126 were formed prior to the formation of any of the contact isolation cavities 130, 134, 142. In practice, the gate-cut cavities 126 could have been formed after the formation of all or any of the contact isolation cavities 130, 134, 142. Similarly, the formation of the contact isolation cavities 130, 134, 142 may be formed in any desired order, e.g., the contact isolation cavities 142 may be formed prior to the formation of the contact isolation cavities 130, 134. Thus, the illustrative processing sequence depicted herein should not be considered to be a limitation of the presently disclosed inventions.

As will be appreciated by those skilled in the art after a complete reading of the present application, there are many novel inventions disclosed herein. One illustrative method disclosed herein includes forming a plurality of transistor devices on a semiconductor substrate 102, each of the transistors comprising a sacrificial gate structure, a gate cap, source/drain regions, source/drain epitaxial semiconductor material 118 in the source/drain regions, a contact etch stop layer 120 positioned above the source/drain epitaxial semiconductor material and an insulating material 116 positioned above the contact etch stop layer 120. In this example, the method also includes forming a plurality of contact isolation cavities 130, 134, 142 by performing at least one etching process sequence 121, wherein the etching process sequence 121 is adapted to sequentially remove the insulating material 116, the contact etch stop layer 120 and the source/drain epitaxial semiconductor material 118, and forming a contact isolation structure in each of the contact isolation cavities. In this example, the method also includes, after forming the contact isolation structures, removing the sacrificial gate structures so as to form a plurality of replacement gate cavities, and forming a final gate structure in each of the plurality of replacement gate cavities.

Another illustrative method disclosed herein includes forming a plurality of transistor devices on a semiconductor substrate 102, each of the transistors comprising a sacrificial gate structure, a gate cap, source/drain regions, source/drain epitaxial semiconductor material 118 in the source/drain regions, a contact etch stop layer 120 positioned above the source/drain epitaxial semiconductor material and an insulating material 116 positioned above the contact etch stop layer 120, and sequentially forming a plurality of patterned etch masks (i.e., at least two) on the product 100. In this example, the method also includes, after forming each of the patterned etch masks, performing an etching process sequence 121 through the patterned etch mask, wherein the etching process sequence 121 is adapted to sequentially remove the insulating material 116, the contact etch stop layer 120 and the source/drain epitaxial semiconductor material 118 so as to form a plurality of contact isolation cavities and forming a contact isolation structure in each of the contact isolation cavities.

In another embodiment, the method also includes removing portions of the layer of insulation material 116 and the contact etch stop layer 120 to expose the source/drain epitaxial semiconductor material 118 in the source/drain regions and thereby form source/drain contact openings 137 that are bounded in at least one direction by a plurality of the contact isolation structures, and forming a conductive source/drain metallization structure 150 in the source/drain contact openings 137.

Yet another illustrative method disclosed herein includes forming a plurality of transistor devices on a semiconductor substrate, each of the transistors comprising a gate sacrificial structure, a gate cap, source/drain regions, source/drain epitaxial semiconductor material 118 in the source/drain regions, a contact etch stop layer 120 positioned above the source/drain epitaxial semiconductor material 118 and an insulating material 116 positioned above the contact etch stop layer 120, forming a first patterned etch mask 128 on the product and performing an etching process sequence 121 through the first patterned etch mask 128, wherein the etching process sequence is adapted to sequentially remove the insulating material 116, the contact etch stop layer 120 and the source/drain epitaxial semiconductor material 118 so as to form a first plurality of contact isolation cavities 130. In this example, the method also includes removing the first patterned etch mask 128, forming a second patterned etch mask 132 on the product and performing the etching process sequence 121 through the second patterned etch mask 132 so as to form a second plurality of contact isolation cavities 134. In this example, the method also includes removing the second patterned etch mask 132, forming a third patterned etch mask 140 on the product, performing the etching process sequence 121 through the third patterned etch mask 140 so as to form a third plurality of contact isolation cavities 142, removing the third patterned etch mask 140 and forming a contact isolation structure in each of the first, second and third contact isolation cavities.

In a further embodiment, the method includes removing portions of the layer of insulation material 116 and the contact etch stop layer 120 to expose the source/drain epitaxial semiconductor material 118 in the source/drain regions and thereby form source/drain contact openings 137 that are bounded in at least one direction by a plurality of the contact isolation structures, and forming a conductive source/drain metallization structure 150 in the source/drain contact openings 137, wherein the conductive source/drain metallization structures 150 are bounded in at least one direction by a plurality of the contact isolation structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a plurality of transistor devices on a semiconductor substrate, each of said transistor devices comprising a sacrificial gate structure, a gate cap, source/drain regions, source/drain epitaxial semiconductor material in said source/drain regions, a contact etch stop layer positioned above said source/drain epitaxial semiconductor material and an insulating material positioned above said contact etch stop layer;
   forming a plurality of contact isolation cavities by performing at least one etching process sequence, wherein said etching process sequence is adapted to sequentially remove said insulating material, said contact etch stop layer and said source/drain epitaxial semiconductor material;

forming a contact isolation structure in each of said contact isolation cavities;

after forming said contact isolation structures, removing said sacrificial gate structures so as to form a plurality of replacement gate cavities; and forming a final gate structure in each of said plurality of replacement gate cavities.

2. The method of claim 1, further comprising:

removing portions of said insulating material and said contact etch stop layer to expose said source/drain epitaxial semiconductor material in said source/drain regions and thereby form source/drain contact openings that are bounded in at least one direction by a plurality of said contact isolation structures; and forming a conductive source/drain metallization structure in said source/drain contact openings.

3. The method of claim 1, wherein said contact isolation structures are comprised of a material that is different than said insulating material such that said insulating material is selectively removable relative to said contact isolation structures by etching.

4. The method of claim 1, wherein performing said etching process sequence comprises:

performing a first etching process that is adapted to remove said insulating material selectively relative to said contact etch stop layer;

performing a second etching process that is adapted to remove said contact etch stop layer selectively relative to said source/drain epitaxial semiconductor material and said insulating material; and performing a third etching process that is adapted to remove said source/drain epitaxial semiconductor material selectively relative to said insulating material and said contact etch stop layer.

5. The method of claim 1, wherein said transistor devices are FinFET devices.

6. The method of claim 1, further comprising:

forming a gate-cut patterned etch mask above said transistor devices;

forming a plurality of etching processes through said gate-cut patterned etch mask to remove exposed portions of said gate caps and a portion of an axial length of each of said sacrificial gate structures so as to form a plurality of gate-cut cavities that are laterally bounded by a sidewall spacer formed adjacent each of said gate structures; and forming a gate-cut isolation structure in each of said gate-cut cavities at the same time as said contact isolation structures are formed in said contact isolation cavities.

7. The method of claim 6, wherein said gate-cut cavities are formed prior to the formation of said contact isolation cavities.

8. The method of claim 2, wherein said conductive source/drain metallization structures are bounded in at least one direction by said plurality of said contact isolation structures.

9. The method of claim 4, wherein said first etching process is an anisotropic etching process, said second etching process is an anisotropic etching process and said third etching process is an isotropic etching process.

10. The method of claim 1, wherein forming said plurality of contact isolation cavities comprises performing said etching process sequence multiple times.

11. The method of claim 1, wherein said sacrificial gate structure comprises a sacrificial gate insulation layer and a sacrificial gate electrode, said sacrificial gate electrode comprising one of polysilicon or amorphous silicon.

12. The method of claim 1, wherein forming said plurality of contact isolation cavities comprises:

sequentially forming a plurality of patterned etch masks above said transistor devices; and after forming each of said patterned etch masks, performing said etching process sequence through said patterned etch masks.

13. A method, comprising:

forming a plurality of transistor devices on a semiconductor substrate, each of said transistor devices comprising a sacrificial gate structure, a gate cap, source/drain regions, source/drain epitaxial semiconductor material in said source/drain regions, a contact etch stop layer positioned above said source/drain epitaxial semiconductor material and an insulating material positioned above said contact etch stop layer;

sequentially forming a plurality of patterned etch masks above said transistor devices;

after forming each of said patterned etch masks, performing an etching process sequence through said patterned etch masks, wherein said etching process sequence is adapted to sequentially remove said insulating material, said contact etch stop layer and said source/drain epitaxial semiconductor material so as to form a plurality of contact isolation cavities;

forming a contact isolation structure in each of said plurality of contact isolation cavities;

after forming said contact isolation structures, removing said sacrificial gate structures so as to form a plurality of replacement gate cavities; and forming a final gate structure in each of said plurality of replacement gate cavities.

14. The method of claim 13, further comprising:

removing portions of said insulating material and said contact etch stop layer to expose said source/drain epitaxial semiconductor material in said source/drain regions and thereby form source/drain contact openings that are bounded in at least one direction by a plurality of said contact isolation structures; and forming a conductive source/drain metallization structure in said source/drain contact openings.

15. The method of claim 13, wherein said contact isolation structures are comprised of a material that is different than said insulating material such that said insulating material is adapted to be selectively removed relative to said contact isolation structures by etching.

16. The method of claim 14, wherein sequentially forming said plurality of patterned etch masks above said transistor devices comprises sequentially forming at least three patterned etch masks above said transistor devices and wherein the method comprises performing said etching process sequence at least three times.

17. The method of claim 13, further comprising:

forming a gate-cut patterned etch mask above said transistor devices;

forming a plurality of etching processes through said gate-cut patterned etch mask to remove exposed portions of said gate caps and a portion of an axial length of each of said sacrificial gate structures so as to form a plurality of gate-cut cavities that are laterally bounded by a sidewall spacer formed adjacent each of said sacrificial gate structures; and forming a gate-cut isolation structure in each of said gate-cut cavities at the same time as said contact isolation structures are formed in said contact isolation cavities.

18. The method of claim 17, wherein said gate-cut cavities are formed prior to the formation of said contact isolation cavities.

19. A method, comprising:

forming a plurality of transistor devices on a semiconductor substrate, each of said transistor devices comprising a sacrificial gate structure, a gate cap, source/drain regions, source/drain epitaxial semiconductor material in said source/drain regions, a contact etch stop layer positioned above said source/drain epitaxial semiconductor material and an insulating material positioned above said contact etch stop layer;

forming a patterned etch mask above said transistor devices;

after forming said patterned etch mask, performing an etching process sequence through said patterned etch mask, wherein said etching process sequence is adapted to sequentially remove said insulating material, said contact etch stop layer and said source/drain epitaxial semiconductor material so as to form a plurality of contact isolation cavities;

forming a contact isolation structure in each of said plurality of contact isolation cavities;

after forming said contact isolation structures, removing said sacrificial gate structures so as to form a plurality of replacement gate cavities; and forming a final gate structure in each of said plurality of replacement gate cavities.

20. The method of claim 19, further comprising:

forming a gate-cut patterned etch mask above said transistor devices;

forming a plurality of etching processes through said gate-cut patterned etch mask to remove exposed portions of said gate caps and a portion of an axial length of each of said sacrificial gate structures so as to form a plurality of gate-cut cavities that are laterally bounded by a sidewall spacer formed adjacent each of said sacrificial gate structures; and forming a gate-cut isolation structure in each of said gate-cut cavities at the same time as said contact isolation structures are formed in said contact isolation cavities.

* * * * *